(12) United States Patent
Yilmaz

(10) Patent No.: US 11,233,141 B2
(45) Date of Patent: Jan. 25, 2022

(54) SELF-ALIGNED AND ROBUST IGBT DEVICES

(71) Applicant: IPOWER SEMICONDUCTOR, Gilroy, CA (US)

(72) Inventor: Hamza Yilmaz, Gilroy, CA (US)

(73) Assignee: IPOWER SEMICONDUCTOR, Gilroy, CA (US)

( * ) Notice: Subject to any disclaimer, the term of this patent is extended or adjusted under 35 U.S.C. 154(b) by 0 days.

(21) Appl. No.: 16/249,432

(22) Filed: Jan. 16, 2019

(65) Prior Publication Data

US 2019/0221657 A1 Jul. 18, 2019

Related U.S. Application Data

(60) Provisional application No. 62/617,994, filed on Jan. 16, 2018.

(51) Int. Cl.
*H01L 29/739* (2006.01)
*H01L 29/08* (2006.01)
(Continued)

(52) U.S. Cl.
CPC ...... *H01L 29/7397* (2013.01); *H01L 21/0209* (2013.01); *H01L 21/266* (2013.01);
(Continued)

(58) Field of Classification Search
CPC ............ H01L 29/7397; H01L 29/0834; H01L 29/417; H01L 29/407; H01L 29/0619;
(Continued)

(56) References Cited

U.S. PATENT DOCUMENTS

| 5,289,019 A | 2/1994 | Terashima |
| 5,614,743 A | 3/1997 | Mochizuki |

(Continued)

FOREIGN PATENT DOCUMENTS

| WO | 2009031001 A2 | 3/2009 |
| WO | 2019143733 A1 | 7/2019 |

OTHER PUBLICATIONS

PCT, International Search Report and Written Opinion of the International Searching Authority for International Application No. PCT/US2019/013865, dated Apr. 15, 2019, 12 pages.

(Continued)

*Primary Examiner* — Patricia D Reddington
(74) *Attorney, Agent, or Firm* — Halit N. Yakupoglu

(57) ABSTRACT

A vertical IGBT device is disclosed. The vertical IGBT structure includes an active MOSFET cell array formed in an active region at a front side of a semiconductor substrate of a first conductivity type. One or more column structures of a second conductivity type concentrically surround the active MOSFET cell array. Each column structure includes a column trench and a deep column region. The deep column region is formed by implanting implants of the second conductivity type into the semiconductor substrate through the floor of the column trench. Dielectric side wall spacers are formed on the trench side walls except a bottom wall of the trench and the column trench is filled with poly silicon of the second conductivity type. One or more column structures are substantially deeper than the active MOSFET cell array.

18 Claims, 22 Drawing Sheets

(51) Int. Cl.

| | |
|---|---|
| *H01L 29/06* | (2006.01) |
| *H01L 21/306* | (2006.01) |
| *H01L 21/266* | (2006.01) |
| *H01L 21/02* | (2006.01) |
| *H01L 29/66* | (2006.01) |
| *H01L 29/417* | (2006.01) |
| *H01L 29/40* | (2006.01) |
| *H01L 29/78* | (2006.01) |
| *H01L 29/10* | (2006.01) |
| *H01L 29/423* | (2006.01) |
| *H01L 29/732* | (2006.01) |

(52) U.S. Cl.
CPC .... *H01L 21/30604* (2013.01); *H01L 29/0619* (2013.01); *H01L 29/0623* (2013.01); *H01L 29/0661* (2013.01); *H01L 29/0821* (2013.01); *H01L 29/0834* (2013.01); *H01L 29/1095* (2013.01); *H01L 29/404* (2013.01); *H01L 29/407* (2013.01); *H01L 29/417* (2013.01); *H01L 29/66348* (2013.01); *H01L 29/7396* (2013.01); *H01L 29/7802* (2013.01); *H01L 29/0638* (2013.01); *H01L 29/0692* (2013.01); *H01L 29/4238* (2013.01); *H01L 29/732* (2013.01); *H01L 2224/49175* (2013.01)

(58) Field of Classification Search
CPC .............. H01L 29/404; H01L 29/7396; H01L 29/7802; H01L 29/0661; H01L 29/1095; H01L 29/0821; H01L 29/0623; H01L 21/30604; H01L 21/266; H01L 21/0209; H01L 29/66348; H01L 29/0692; H01L 29/0638; H01L 29/4238; H01L 29/732; H01L 2224/49175
See application file for complete search history.

(56) References Cited

U.S. PATENT DOCUMENTS

| | | | |
|---|---|---|---|
| 6,124,179 A | 9/2000 | Adamic, Jr. | |
| 6,605,830 B1 | 8/2003 | Kusunoki | |
| 6,693,024 B2 | 2/2004 | Lehmann et al. | |
| 7,132,321 B2 | 11/2006 | Kub et al. | |
| 7,250,639 B1 | 7/2007 | Suekawa | |
| 7,635,892 B2 | 12/2009 | Tokuda et al. | |
| 7,659,576 B2 | 2/2010 | Okada et al. | |
| 7,666,711 B2 | 2/2010 | Pagaila et al. | |
| 7,713,794 B2 | 5/2010 | Iwamuro | |
| 7,825,492 B2 | 11/2010 | Blanchard | |
| 8,350,289 B2 | 1/2013 | Tsukuda | |
| 8,421,184 B2 | 4/2013 | Koyama et al. | |
| 8,502,345 B2 | 8/2013 | Nemoto et al. | |
| 8,618,557 B2 | 12/2013 | Yoshikawa | |
| 8,643,086 B2 | 2/2014 | Pfirsch et al. | |
| 9,129,851 B2 | 9/2015 | Kouno et al. | |
| 9,190,511 B2 | 11/2015 | Pfirsch et al. | |
| 9,337,262 B2 | 5/2016 | Blanchard | |
| 9,419,117 B2 | 8/2016 | Aketa et al. | |
| 9,478,646 B2 | 10/2016 | Bhalla et al. | |
| 9,530,874 B2 | 12/2016 | Kitagawa | |
| 9,691,887 B2 | 6/2017 | Philippou et al. | |
| 9,825,128 B2 | 11/2017 | Yilmaz | |
| 10,418,471 B2 | 9/2019 | Alexander et al. | |
| 10,566,462 B2 | 2/2020 | Schulze et al. | |
| 2004/0082116 A1 | 4/2004 | Kub et al. | |
| 2005/0059216 A1 | 3/2005 | Verma et al. | |
| 2005/0158956 A1 | 7/2005 | Poon et al. | |
| 2006/0267091 A1 | 11/2006 | Takahashi | |
| 2008/0237704 A1* | 10/2008 | Williams | H01L 21/761 257/338 |
| 2009/0020811 A1* | 1/2009 | Voldman | H01L 29/66659 257/337 |
| 2012/0056201 A1 | 3/2012 | Wada et al. | |
| 2013/0181253 A1* | 7/2013 | Huang | H01L 29/0619 257/139 |
| 2014/0027841 A1* | 1/2014 | Bhalla | H01L 29/404 257/330 |
| 2016/0218186 A1* | 7/2016 | Masuda | H01L 21/0465 |
| 2017/0243745 A1* | 8/2017 | Yilmaz | H01L 29/407 |

OTHER PUBLICATIONS

PCT, International Search Report and Written Opinion of the International Searching Authority for International Application No. PCT/US2019/017114, dated Apr. 29, 2019, 15 pages.

* cited by examiner

SELF-ALIGNED AND ROBUST IGBT DEVICES

CROSS REFERENCE TO RELATED APPLICATION

This application relates to and claims priority from U.S. provisional patent application Ser. No. 62/617,994 entitled "Self-Aligned and Robust IGBT" filed on Jan. 16, 2018, which is expressly incorporated by reference herein in its entirety.

BACKGROUND

Field of the Invention

The present invention relates to insulated gate semiconductor devices, more particularly, to device structures and methods of forming insulated gate bipolar transistor (IGBT) semiconductor devices.

Description of the Related Art

An IGBT (insulated gate bipolar transistor) is a wide base PNP Bipolar Junction Transistor (BJT) device driven by a MOSFET becomes a key power device handling high current and high voltage motor control and induction heating type applications. In order to improve IGBT efficiency and robustness, there is a continuous research and development to reduce forward voltage drop, Vce-Sat (collector-emitter saturation voltage), minimize the switching losses and also to improve safe operation area (SOA) of IGBT.

Forward voltage drop, Vce-Sat can be reduced by low MOSFET resistance, which provides the base current for vertical PNP BJT, by spreading resistance among the MOSFET cells located at the upper portion of the IGBT and by the high levels of carrier modulation in wide n-base region of the PNP BJT, which is impacted by minority carrier life time and the injection efficiency carrier modulation.

Unfortunately, high levels of carrier modulation or storage also increases switching losses by slowing the turning-off speed and degrade the SOA of IGBT. Another tradeoff between low MOSFET on-state resistance per unit area across the drain and source terminals (Rds) which results usually with higher saturation and shorter withstand time during the mode of load short circuit for motor drive application. Base to source shorting of parasitic NPN BJT as part of MOSFET is very critical to prevent latch up and enhance IGBT robustness.

The present inventions enables robust and efficient IGBT device production by optimizing Vce-Sat, turn off speed and safe operation area (SOA) by spreading resistance reduction, controlling carrier injection and forming deeper junctions by poly silicon trenches.

SUMMARY

An aspect of the present invention includes a vertical insulated gate bipolar transistor (IGBT) device, comprising an active metal-oxide-semiconductor field-effect transistor (MOSFET) cell array formed in a front side of a semiconductor substrate of a first conductivity type; and at least one column structure of a second conductivity type formed in the semiconductor substrate, the at least one column structure being concentrically surrounding the active MOSFET cell array, at least one column structure including a trench filled with poly silicon of the second conductivity type, dielectric side wall spacers formed on the trench side walls except a bottom wall of the trench, and a deep region of the second conductivity extending from the bottom wall of the trench, wherein the at least one column structure is substantially deeper than the active MOSFET cell array and wherein the first conductivity type is n-type and the second conductivity type is p-type.

Another aspect of the present invention provides a vertical insulated gate bipolar transistor (IGBT) device, comprising an active metal-oxide-semiconductor field-effect transistor (MOSFET) cell array formed in a front side of a semiconductor substrate of n-type conductivity; and at least one column structure of p-type conductivity formed in the semiconductor substrate, the at least one column structure being concentrically surrounding the active MOSFET cell array, at least one column structure including a trench filled with p-poly silicon, p-doped side wall regions formed on the trench side walls except a bottom wall of the trench, and a p-type deep region extending from the bottom wall of the trench, wherein the at least one column structure is substantially deeper than the active MOSFET cell array, and wherein the p-doped side wall regions prevent p-dopant depletion in p-doped poly silicon.

Another aspect of the present invention provides a method of forming a vertical insulated gate bipolar transistor (IGBT) device, comprising providing a semiconductor substrate of a first conductivity type having a front side and a backside, forming a column structure of a second conductivity type concentrically surrounding a region of the front side of the semiconductor substrate, forming of the column structure including forming a column trench in the front side of the semiconductor substrate, the trench including trench side walls and a trench floor, forming dielectric spacers on the trench side walls, forming a column deep region extending downwardly from the trench floor by applying dopants of the second conductivity type into the semiconductor substrate through the trench floor, filling the trench with poly silicon of a second conductivity which is in contact with the column deep region; and depositing an oxide layer including silicon oxide onto the front side of the semiconductor substrate including the column trenches filled with the poly silicon; planarizing the oxide layer; depositing an etch stop layer including silicon nitride on the oxide layer; applying a photomask on the etch stop layer; and forming at least one metal-oxide-semiconductor field-effect transistor (MOSFET) cell in the region concentrically surrounded by the column structure, wherein the first conductivity type is n-type and the second conductivity type is p-type.

DESCRIPTION

Figure 1A:
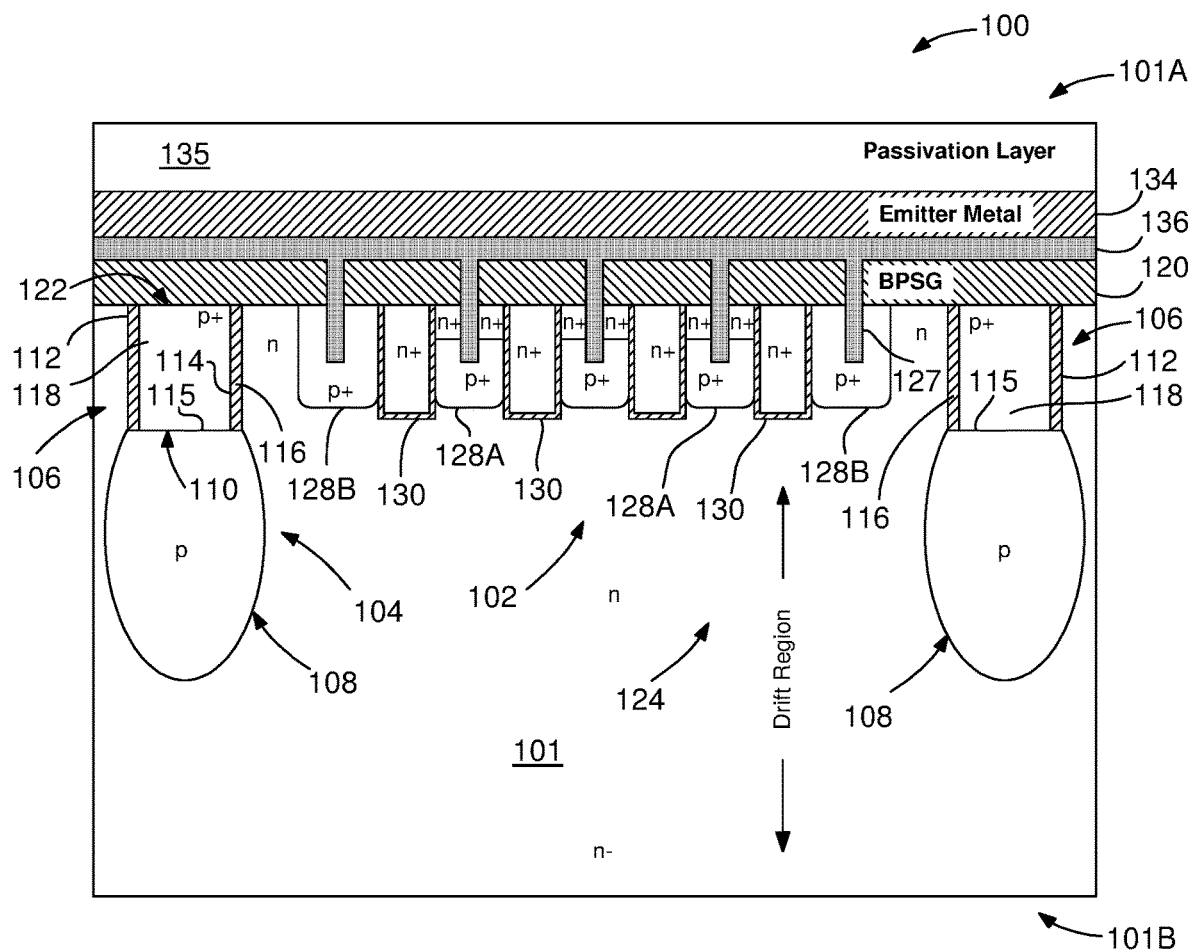
FIG. 1A illustrates an IGBT structure according to an embodiment showing trench MOSFET cells with p-column.

In the below described exemplary embodiments, the present invention provides IGTB devices having wall-like deep barrier structures fully surrounding the active MOSFET cell arrays, which may be formed in a semiconductor layer of opposing conductivity type and shaped as a column, or column structure, in cross-section having a trench section and an implanted region extending from the trench floor deep into the semiconductor layer. This continuous barrier structure surrounding the active MOSFET cells will be referred to as column or column ring hereinafter.

When the trench section and the implanted section of the column have p-type conductivity, the column is a p-column, or a deep p-column, i.e., the column with p-type conductivity. In this respect, the trench section of the p-column may includes a p+ poly silicon (p+ poly Si) filler material and the implanted region includes a p-type implant or dopant implanted region. Such deep p-columns may electrically float during an on-state of the IGTB device, i.e., when the IGBT device is turned on, and may reduce voltage drop across the emitter and collector terminals of the IGBT device. Furthermore, such deep p-columns may improve the breakdown voltages compared to the prior art trench IGBT devices without the deep p-columns.

As will be described more fully below, columns of the present invention may be formed using several methods. In one embodiment, the p-columns of IGBT devices may have oxide spacers or dielectric spacers on the trench side walls to confine p+ poly Si within the trenches so as to prevent any sideway p-type implant (boron ion) diffusions into the neighboring device regions. In another embodiment, the p-column trench side walls may be implanted with p-type implants to form implanted regions or shields on the trench side walls, without utilizing oxide spacers on the side walls of the trenches.

In an embodiment of an IGBT device forming process, contact windows of MOSFET p-bodies and the active MOSFET trench gates may be formed at the same time, thus the gate trenches and the p-body contact trenches are self-aligned. As a result, p+ contact implant of the p-body may uniformly impact the MOSFET threshold voltage due to elimination of mask misalignment, which enhances latch up capability of the IGBT device. In a non-self-aligned trench and p-body type structures, a misaligned p+ implantation may raise the threshold voltage on one side of the IGBT active cell while the other side of the IGBT cell may have less p-body charge, thus high base to emitter shorting resistance of parasitic NPN bipolar junction transistor (BJT) may be high. If the shorting resistance of base to emitter of NPN BJT is high, NPN BJT can be turned on at lower current levels, which may lower the IGBT latch up current capability. This is because when the NPN BJT and wide base PNP BJT total current gains reach to 1, the IGBT may latch up.

During an IGBT device manufacturing process, conventionally, the front side wafer process, including the front side metallization, may be initially completed, which is followed by the backside process. For the backside, leading edge IGBT devices may require a laser backside annealing tool which is a high cost tool. The backside annealing tool may not be available for many wafer foundries. In an embodiment of the present invention, the wafer backside process may be advantageously completed, before the front side metallization process step, to activate the backside implant, for example, using a rapid thermal annealing (RTA) tool. Conducting the backside process steps before the front side metallization may have its advantages, because depositing the front metal first may limit the maximum temperature, that the wafers can be exposed during the backside process, to usually less than 450° C. At 450° C. or lower temperatures, the implant activation rate occurring during the backside process may be significantly low, e.g., around 1%. Conventionally, a high voltage (HV) termination structure may require an n+ region in the outer periphery of the IGBT device to prevent a depletion region (called "channel stop") to extend up to sawn edges of the device and prevent leakage current during the voltage blocking mode (off state of the IGBT). A novel HV termination structure including a trench MOS channel stops and floating deep p-columns may enable robust and reliable edge termination, which is another benefit of the present invention.

Figure 1B:
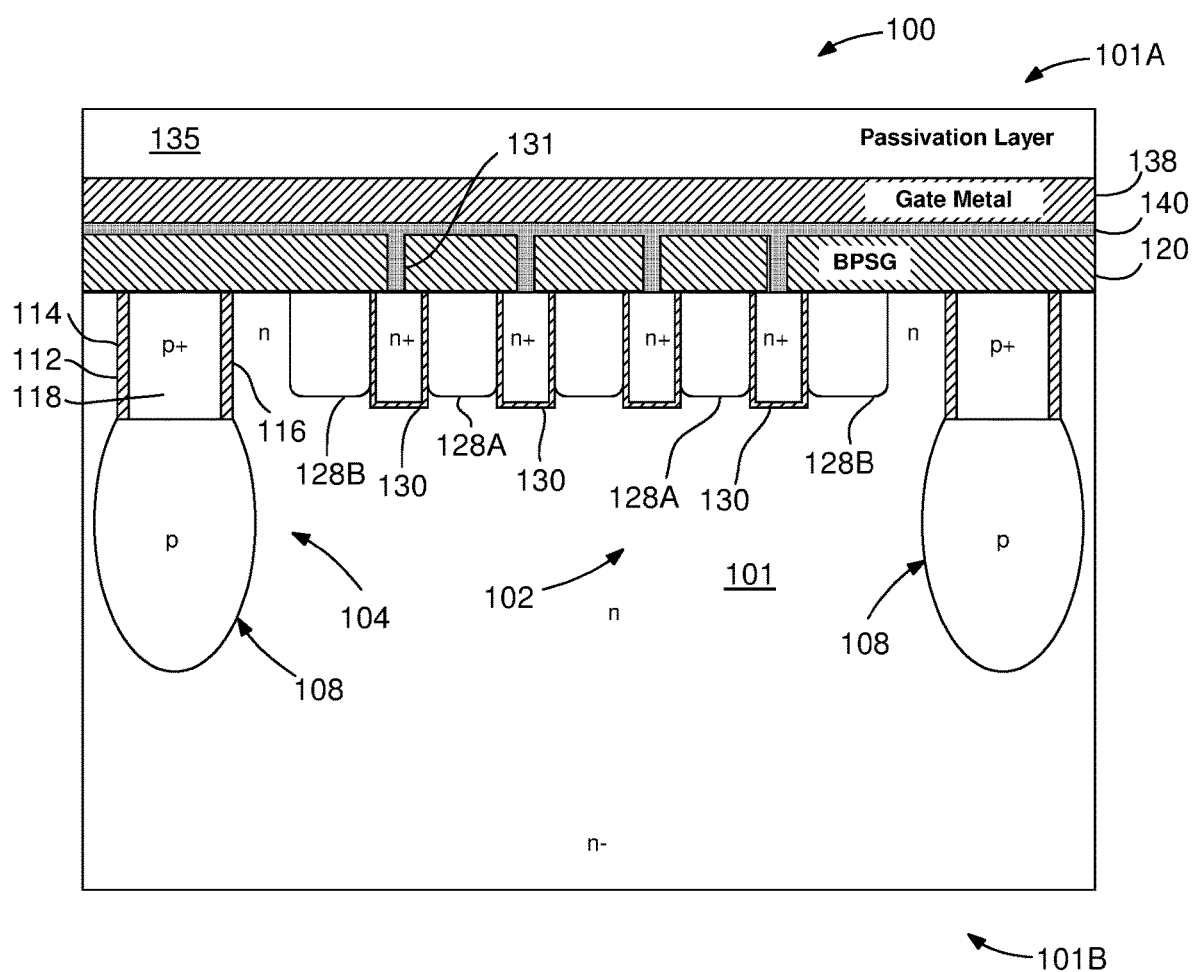
FIG. 1B illustrates an IGBT structure with gate metal and n+ poly Si contact region.
Figure 4A:
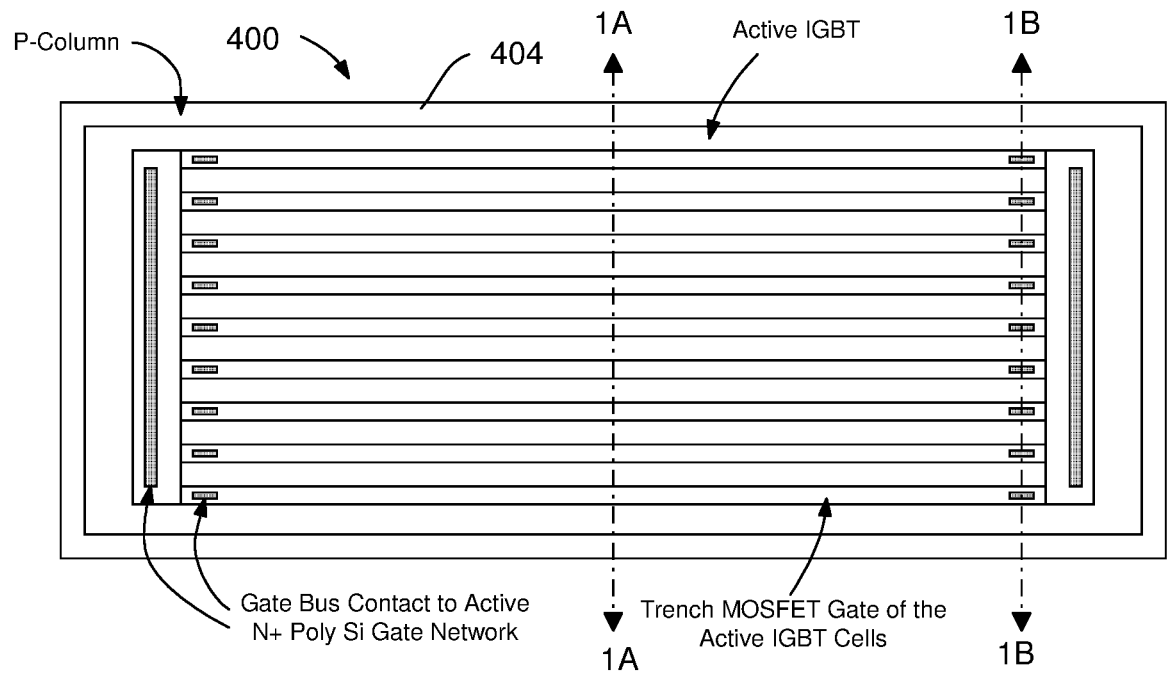
FIG. 4A illustrates in top view p-column encircling the IGBT active device cells.

Turning now to the Figures, FIGS. 1A and 1B may show exemplary cross-sections taken along the lines A1-A1 and B1-B1 (with reduced number of exemplary MOSFET cells)

in FIG. 4A respectively. FIG. 4A shows in top view an exemplary IGBT unit-cell 100 or IGBT cell 100.

FIG. 1A illustrates an embodiment of a vertical IGBT cell 100 formed in an n-type semiconductor substrate 101, or a base region 101, and at a front side 101A of the semiconductor substrate. The base region 101 may be a single crystal semiconductor of n-type conductivity (first type conductivity), for example n-type silicon semiconductor. A center portion of the IGBT cell 100 may include an array of MOSFET cells 102 connected in parallel. For purposes of clarity a reduced number of MOSFET cells 102 are used in the cross sectional FIGS. A-1B.

An edge region of the IGBT cell 100 may include a column 104, or a column structure 104, fully surrounding the MOSFET cells 102. The column 104 may have p-type conductivity or second type conductivity. There may be more than one column 104, which are concentrically surrounding the array of MOSFET cells 102 for the high voltage protection of the MOSFET cells. In FIGS. 1A and 1B, the column 104 is used for high voltage (HV) protection of the MOSFET cells 102. The MOSFET cells 102 may be trench MOSFET cells in this embodiment. The column 104 may include a column base 106 connected to a buried region 108 (implanted region) or a deep region 108 via a trench interface 110. The column base 106 may include a column trench 112 having trench side walls 114 and trench floor 115 defining the column trench 112. The column trench 112 may include a trench spacer 116 or a spacer 116 formed on the trench side walls 114 and a trench filler 118 filling the column trench 112 which is in contact with a dielectric layer 120, such as an BPSG layer, via a column interface 122. A drift region 124 within the base region 101 may extend from the trench MOSFET cells 102 and along the base region 101.

The trench MOSFET cells 102 may include p-body contact regions 128 including p-body contacts 127. The p-body contact regions 128 may be separated from one another by gate contact trenches 130 or gate trenches 130 for gate contacts 131 (shown in FIG. 1B). The gate trenches 130 may be filled with n+ poly silicon (n+ poly Si contact regions). The p-body contact regions 128 may have inner p-body contact regions 128A and outer p-body contact regions 128B, both of which are heavily p doped. The inner p-body contact regions 128A may include n+ emitter contact regions 132. The emitter metal 134 may be connected to the n+ emitter contact regions 132 and p-body contact regions 128 by a Ti/TiN/W buffer metal 136 extending through the dielectric layer 120, thereby forming the p-body contacts 127 extending into the p-body contact regions 128. A passivation layer 135 may coat the front side 101A.

In one embodiment, the trench filler 118 of the column 104 may be p+ poly silicon material and the deep region 108 may be a p-region, p type implant implanted deep region, or a deep p-region. The deep regions 108 of the IGBT structure may be floating electrically, i.e., they have no direct ohmic contact to any electrode. Here, p+ denotes a high p type dopant material, such as boron (B), concentration, and p denotes a lower p-type dopant material concentration. Since both the column base 106 and the deep region 108 include p type dopants, the columns 104 may be called p-columns. In one embodiment, the deep regions 108 may be formed by implanting high energy boron implants through the floor 115 of the column trenches 112 that may be formed in the base material 101 which is n type silicon. The spacers 116 may be oxide spacers formed on the trench side walls 114 by oxidizing the trench sidewalls 114 and the column trench 112 is filled with the trench filler 118, i.e., p+ poly silicon (p+ poly Si). High energy p ion implanted deep regions 108 of the columns 104 may be in direct contact with the p+ poly Si trench filler 118.

The spacers 116 may confine the lateral diffusion of boron in the column trench 112 and may keep the column's deep region 108 in its bulb-shape which may be narrow at the top and wide at the bottom adjacent the trench interface 110. The columns 104 may be formed 5 to 20 micrometers (μm) apart from each other depending on the n doping concentration of the base region 101, thus the spacing of the columns 104 may depend on the voltage rating of the IGBT device.

The column 104 is formed in the active area of the IGBT unit cell 100, which is a region of the device inner portion of the HV edge termination region, encircling the MOSFET cells 102 (planar MOSFETs or trench MOSFETs). When IGBT cell 100 is in off-state (voltage blocking mode), the column 104 pinch off below the breakdown of the MOSFET cells 102 which are being encircled by the column 104 shown for example in FIG. 4A. Accordingly this may demonstrate how IGBT devices having shallow p-body diffusions and shallow trenches may support very high voltage blocking (equal or greater than 1000 V).

The columns 104 may electrically float to improve carrier modulation just below the active IGBT cells to reduce on state voltage across collector-emitter (Vce-Sat) thus reduce power dissipation of the IGBT device. P+ poly Si trench filler 118 is directly in contact with the deep P region 108 and indirectly in contact with drift region 124 of the IGBT cell 100, and thus the trench filler 118 may act like a defect gathering center which may improve carrier life and reduce IGBT device leakages. The direct contact between the deep p region 108 and indirect contact between the drift region 124 and the trench filler 118 may be established through the trench floor 115.

In an embodiment, the contacts in the p-body regions 128 and the n+-emitter regions 132 may be self-aligned to the gate trenches 130 and filled with buffer metal, Ti/TiN/W after forming the contact openings. P+ implant does not impact threshold voltage (VT) of the IGBT device.

The IGTB structure of the present invention may provide the following benefits. For example, one benefit may be that the IGBT structure of the present invention may prevent IGBT latch up and hence make the device more robust. Another benefit may be that the IGBT structure may have poly silicon only inside the trenches, not over the surface, thus CMP (Chemical Mechanical Polishing) may be used in ease to planarize the trenches. The active device cell density may also be increased to drive lower gain PNP BJT for faster IGBT devices. Furthermore, higher density trench MOS may reduce the spreading resistance in the active device area at the top surface region or the front side 101A. Higher trench MOS density even if the n+ source (or n+ emitter for IGBT) periphery is reduced to limit the IGBT saturation current for motor control applications to increase device robustness during "Shorted Load Test" or "Short Circuit Test", spreading resistance in the vicinity of the trench side walls and the bottom regions may be reduced.

FIG. 1B illustrates an exemplary gate metal section of the IGBT unit cell 100. A gate metal 138 is connected to the gate trenches 130 via a Ti/TiN/W buffer metal 140 extending through the dielectric layer 120. The gate trenches 130 include n+ poly Si. Gate contacts 131 to n+ poly Si may be planar type, not trench type, because the gate contact forming step may only include the etching of the BPSG dielectric layer 120. The gate contact forming step may not include Si etching process.

Figure 1C:
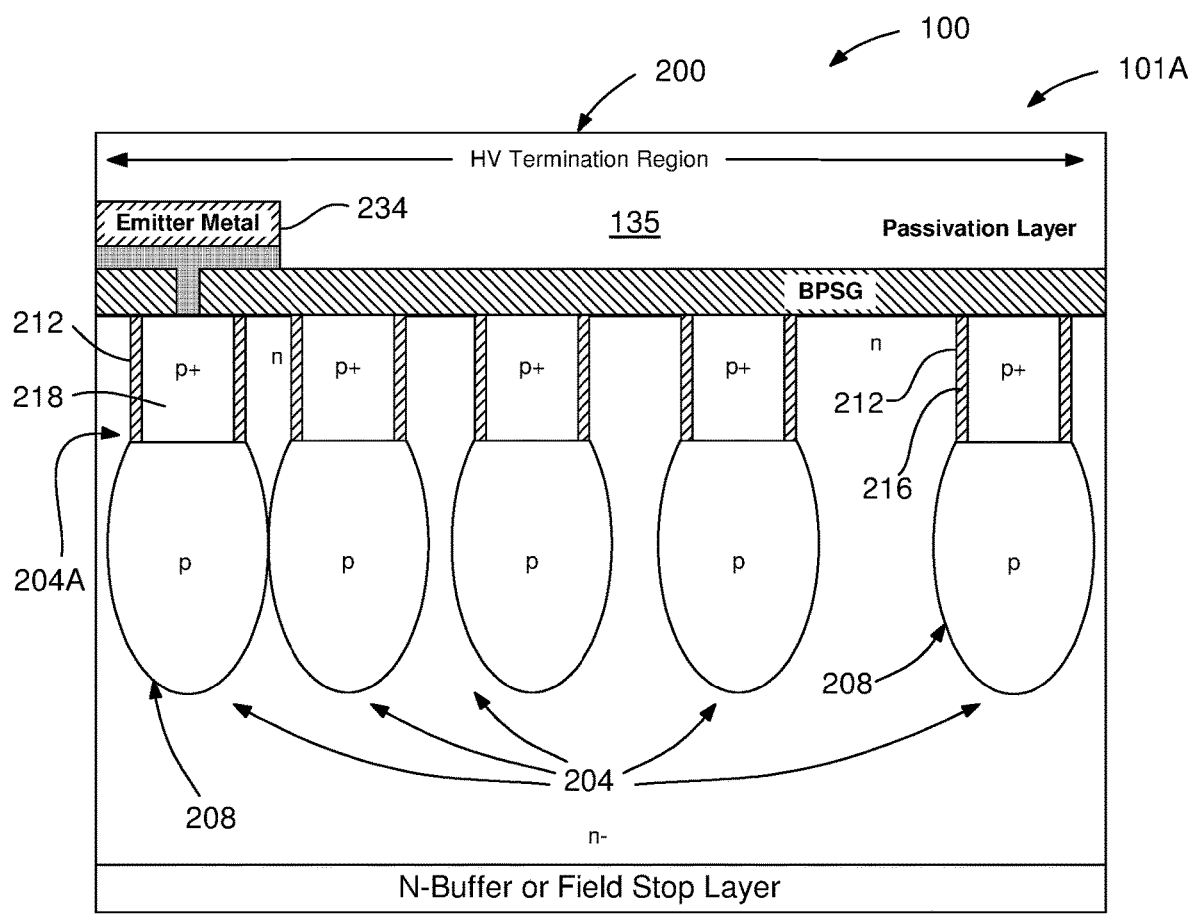
FIG. 1C illustrates an IGBT structure with high voltage (HV) termination region.
Figure 1D:
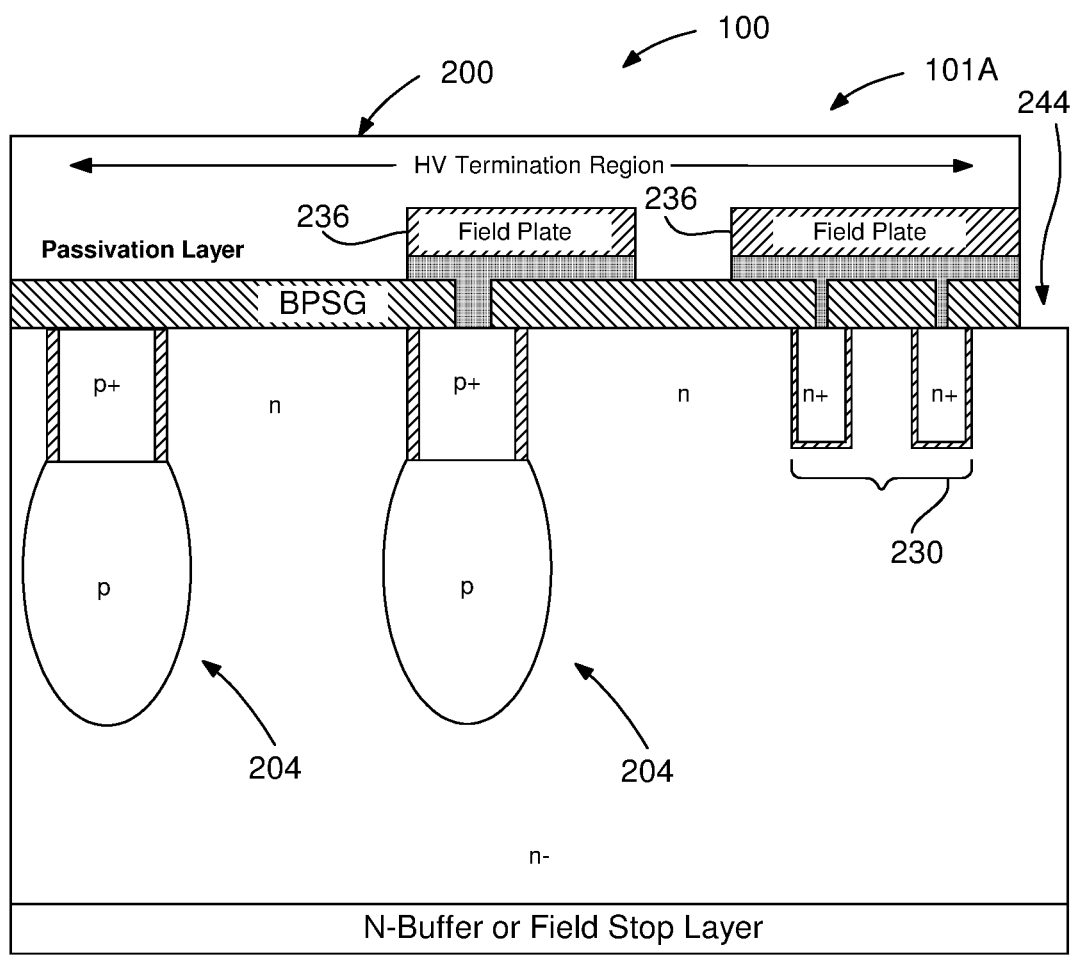
FIG. 1D illustrates an IGBT structure with a channel region after the last p-column ring of HV termination region.

FIGS. 1C-1D illustrate an embodiment of an exemplary high voltage (HV) termination region 200 used for encircling the Active MOSFET cell array. The HV termination region 200 may be formed using p-columns 204 (for an n-type semiconductor substrate) having varying separation distances between them.

Figure 4B:
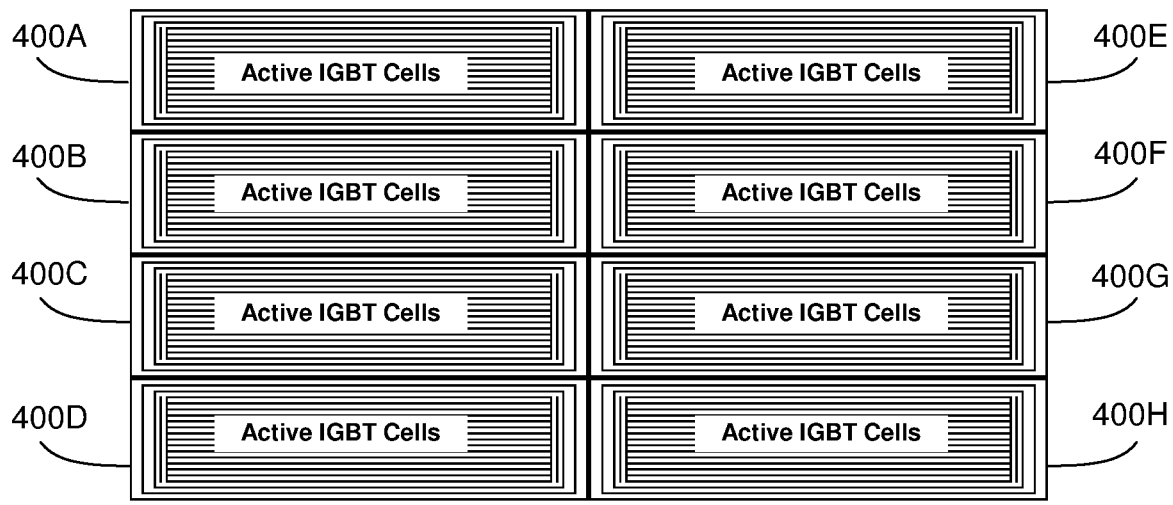
FIG. 4B illustrates in top view multiple IGBT active device cells.
Figure 4C:
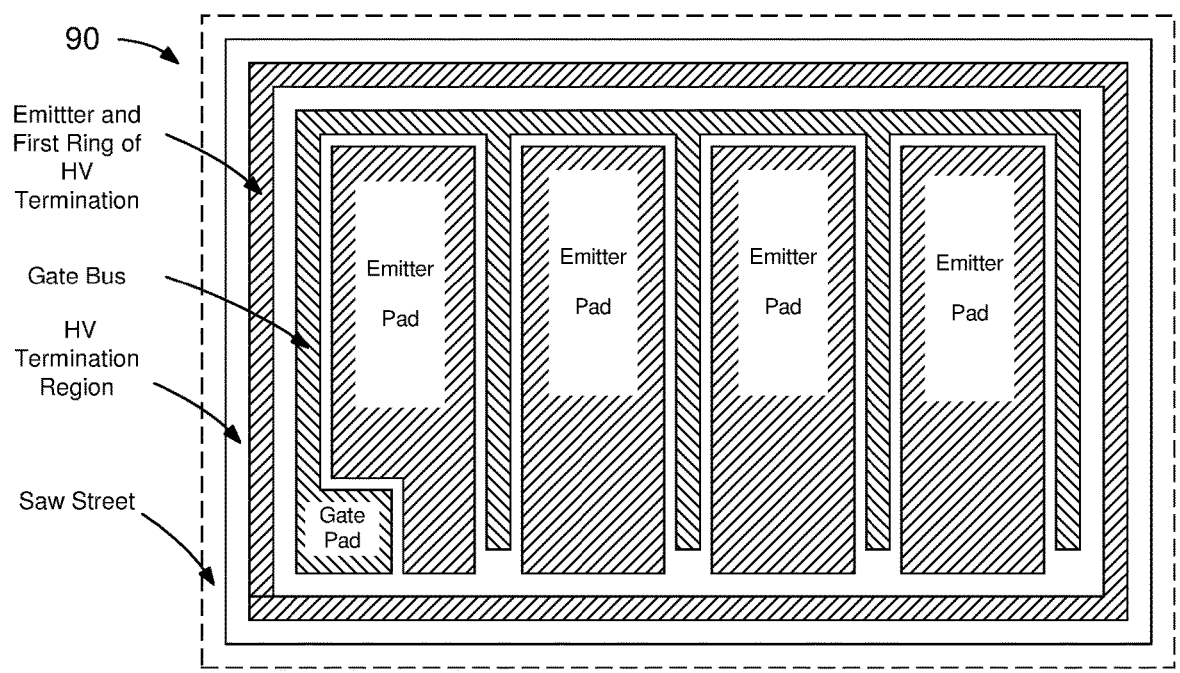
FIG. 4C illustrates in top view of an IGBT device, p-columns being hidden under the emitter metal.

As shown in FIG. 1C, in one embodiment, p-columns 204 in the HV termination region 200 may fully encircle the active device region by forming concentric p-column rings (FIG. 4C). A first p-column ring 204A may be shorted to the emitter metal 234 to drain out stored charge in the HV termination region 200. After forming the first p-column ring 204A, other p-column rings 204 may be formed while increasing space between them to minimize surface electric field to achieve minimum area for high voltage termination. Further, p+ poly Si filler 218 within the column trench 212 is confined by the oxide spacers 216 to prevent p+ dopant sideway diffusion to save area and establish voltage division by deep p-regions 208. The deep p-regions 208 are connected to p+ poly Si filling the column trench 212 to minimize surface electric field sensitivity due to external charge from the package and the assembly environment.

As shown in FIG. 1D, at a distal edge of the HV termination region 200 adjacent to a saw street 244, MOS cells 230 in contact with field plates 236 are placed to stop HV depletion reaching the die edge, or substrate edge, (sawn region), thereby preventing and leakage current. Field plates 236 are conductors used over a dielectric to help reduce surface electric field.

Figure 2A:
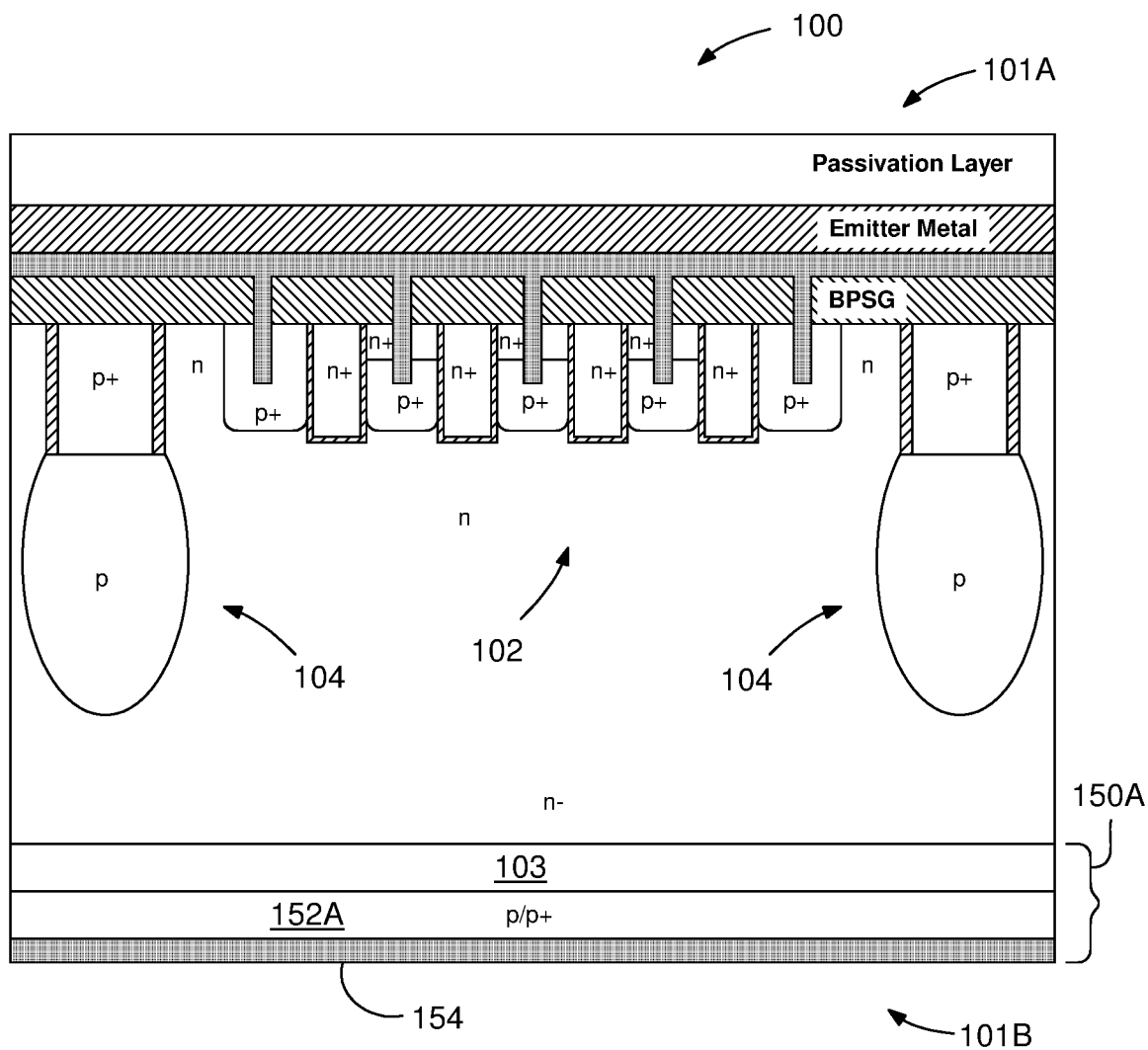
FIG. 2A illustrates an IGBT structure with n-buffer and p/p+ layers.
Figure 2B:
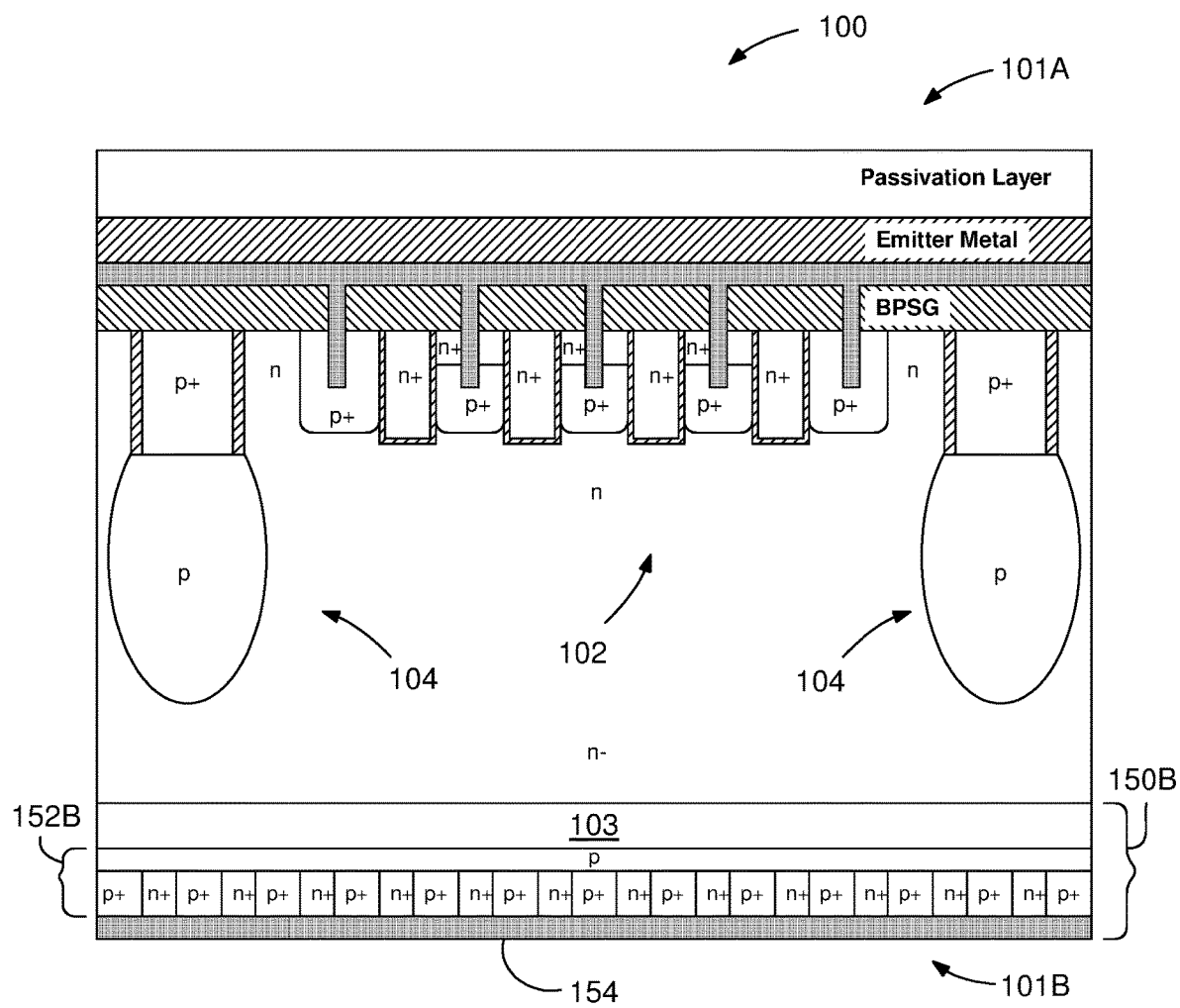
FIG. 2B illustrates an IGBT structure with backside with p+ and n+ regions to control injection.
Figure 2C:
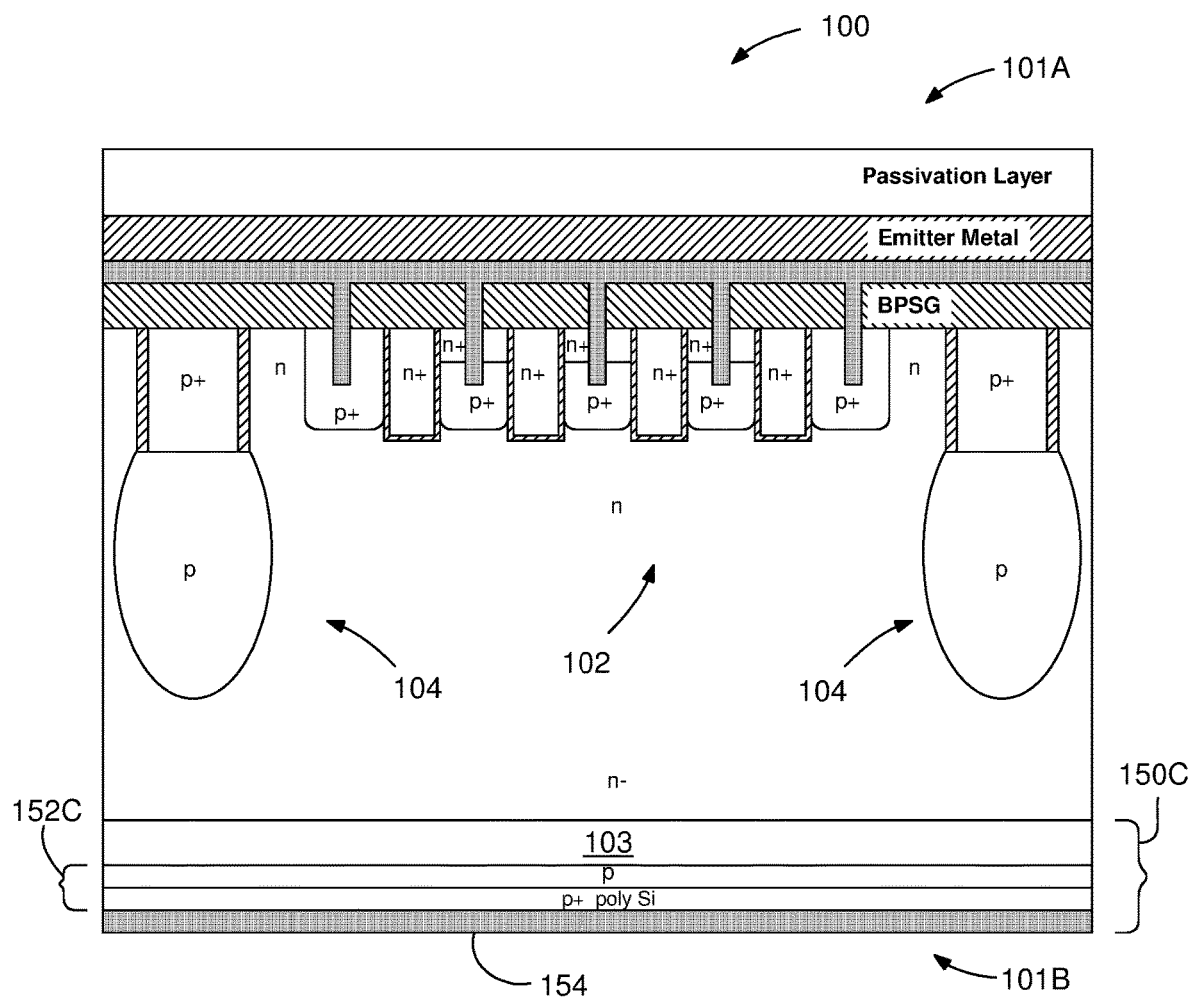
FIG. 2C illustrates an IGBT structure with backside p+ poly Si to control injection.

FIGS. 2A-2C illustrate various backside structures 150 at the backside 101B of the semiconductor substrate 101 for the IGBT cell shown in FIGS. 1A-1D.

FIG. 2A illustrates a backside structure 150A of the IGBT cell 100 including an n-buffer or field stop layer 103 and a collector metal 154 as well as p and p+ hole injection regions 152A to control hole injection in the IGBT cell 100. Although FIG. 2A shows the front side structure shown in FIG. 1A, all the front side structures shown in FIGS. 1A-1D may have the backside structure 150A shown in FIG. 2A.

FIG. 2B illustrates an embodiment of the backside structure 150B including n-buffer or field stop layer 103 and the collector metal 154 as well as p and p+/n+ hole injection regions 152B to control hole injection in the IGBT cell 100. Although FIG. 2B shows the front side structure shown in FIG. 1A, all the front side structures shown in FIGS. 1A-1D may have the backside structure 150B shown in FIG. 2B.

FIG. 2C illustrates a backside structure 150C including n-buffer or field stop layer 103 and the collector metal 154 as well as p and p+ doped poly Si hole injection regions 152C to control hole injection in the IGBT cell 100. Although FIG. 2C shows the front side structure shown in FIG. 1A, all the front side structures shown in FIGS. 1A-1D may have the backside structure 150C shown in FIG. 2C.

Figure 3A:
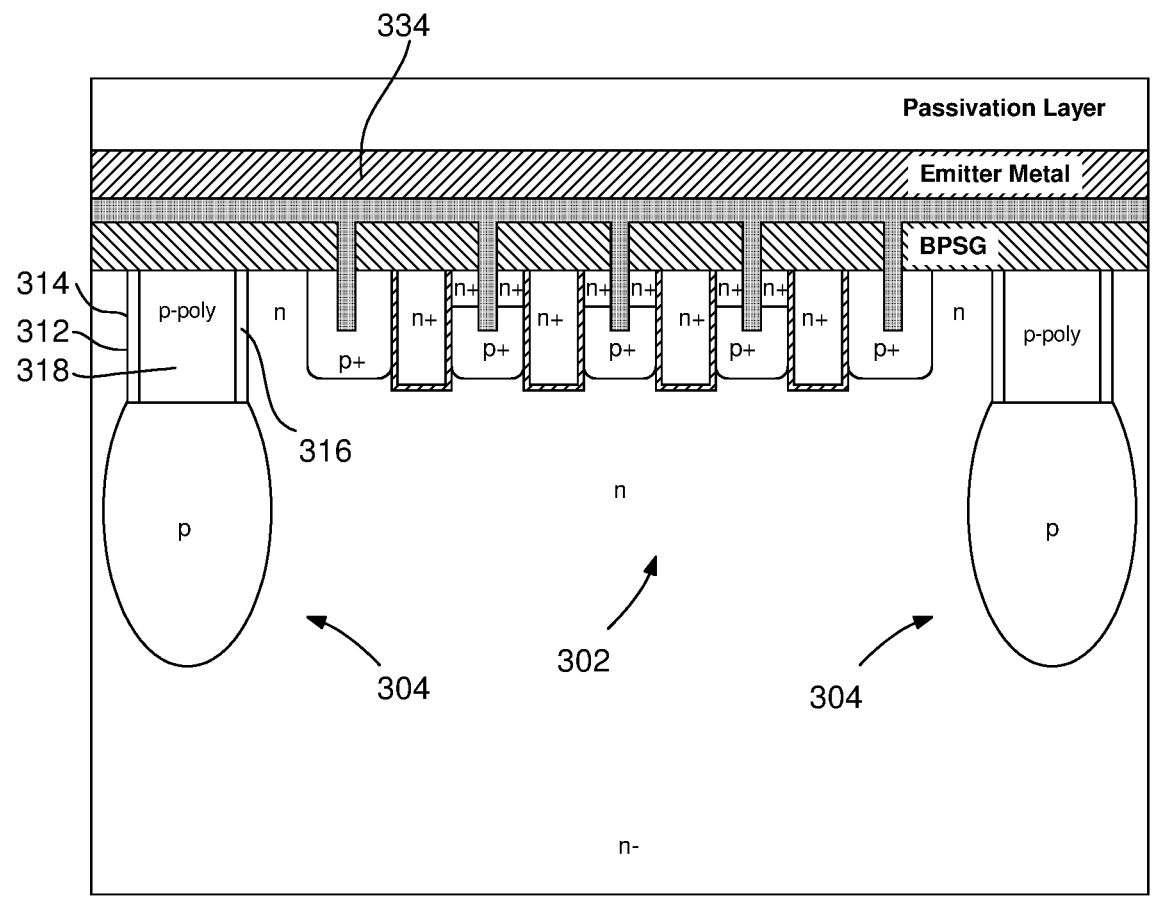
FIG. 3A illustrates an alternative IGBT structure including trench MOSFET cells protected by p-columns without oxide spacers.

FIG. 3A illustrates an alternative IGBT cell 300 according to present invention, which includes trench MOSFET cells 302 fully surrounded and protected by the column structure 304, or column 304 or pp-column 304, without oxide spacers at the trench side walls. In this embodiment of the IGBT cell 300, the trench side walls 314 may not include oxide spacers and the heavily doped p+ poly silicon (p+ poly Si) filler of the previous embodiment (FIG. 1A) may be replaced with lightly p-doped poly silicon (p-poly Si) filler 318. P+ poly Si has a higher dopant rate than the p-poly Si. The column 304 with electrically floating p-poly Si filler 318 and the deep p region 308 may improve carrier modulation in the region close to MOSFET cells 302 during "on-state" to reduce Vce (collector to emitter voltage) and to protect MOSFET cells during "off-state" of the IGBT cell 300.

Trench filler material p-poly Si 318 of the column 304 may have minimal lateral diffusion of the p-type dopant as opposed to p+ poly Si of the previous embodiment (FIG. 1A). Further, p-poly Si may be shielded within the column trench 312 by forming shields 316 on the trench side walls 314 by implanting a p-type dopant to the side walls of the column trench 312. The shields 316 may prevent depletion during the HV blocking state of the IGBT device to avoid high leakage due to the poly silicon's large EHP (electron-hole pair) generation at the poly crystal silicon boundaries.

Figure 3B:
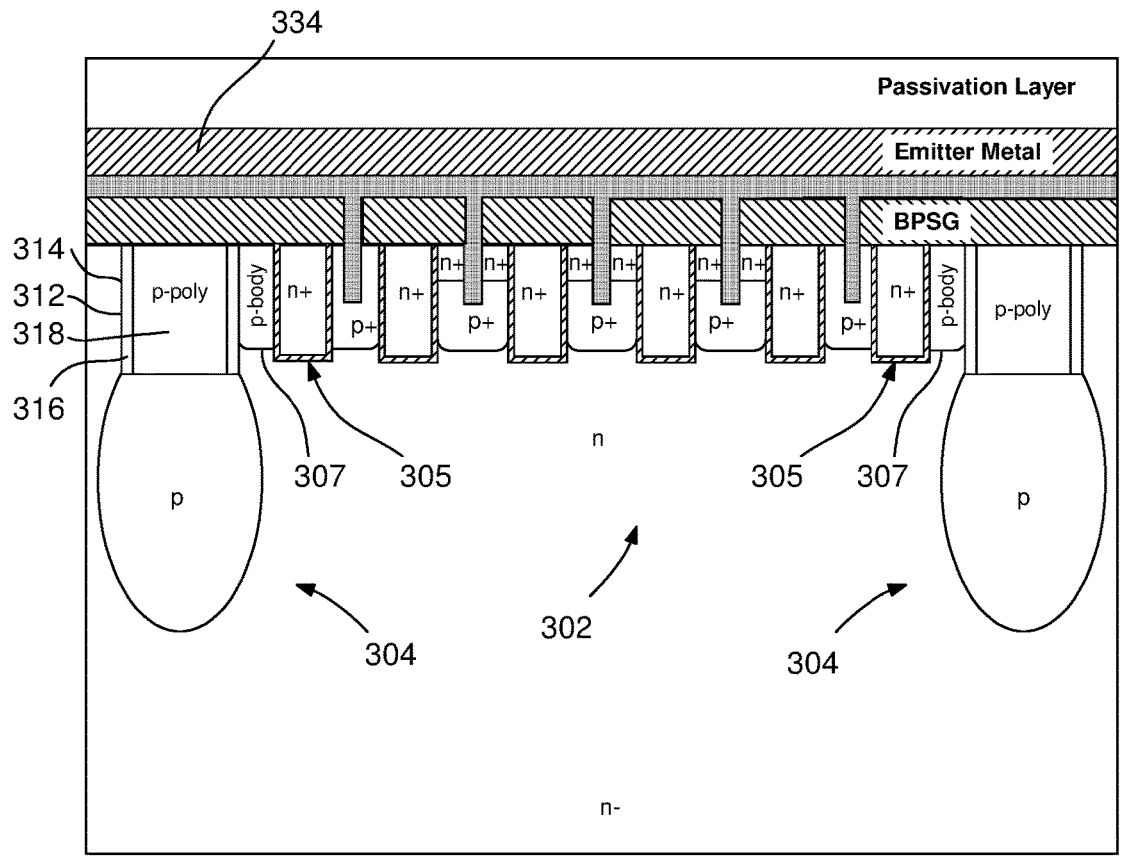
FIG. 3B illustrates an alternative IGBT structure with p-isolation trench MOS structure with p-columns.

FIG. 3B illustrates an alternative IGBT cell structure according to present invention, which may include isolation structures. An isolation structure, for example, a p-isolation trench MOS structure 305 may be placed between the columns 304 and an outer p-body contact region of the MOSFET cells 302.

The isolation structures may reduce the required reverse bias voltage to stop electrical floating of the columns 304. At lower reverse bias voltage, the depletion of the regions between the columns 304 enables thinner and shallow p-body type IGBT device fabrication.

In most applications, negative gate-emitter voltage (Vge) is applied to turn off IGBT devices. Referring back to FIG. 2B, the negative Vge may create a p-channel via p-body regions 307 of the p-isolation trench MOS 305 and the active trench MOSFET cells 302 may turn on, which may establish electrical connection between the floating columns 304 and the p-body of the trench MOSFET cells 302. The p-channel may be an inverted n region portion below the p-isolation trench MOS 305. Since p-body of the trench MOSFET cells 302 are connected to the emitter electrode 334, the column 304 may be indirectly connected to the emitter electrode 334, which may in turn drain out stored holes faster during the IGBT cell's turn off stage.

When the IGBT cell 300 is turned off (off-state), stored holes in the vicinity of floating columns 304 may be drained out faster, thus the IGBT cell 300 may have a shorter turn-off time. With the applied positive Vge during on-state of the IGBT cell 300, a portion of the n-region between the p-columns and the p-body of the IGBT cell 300 may be electron accumulated, which may float the columns 304 for low Vce.

Figure 3C:
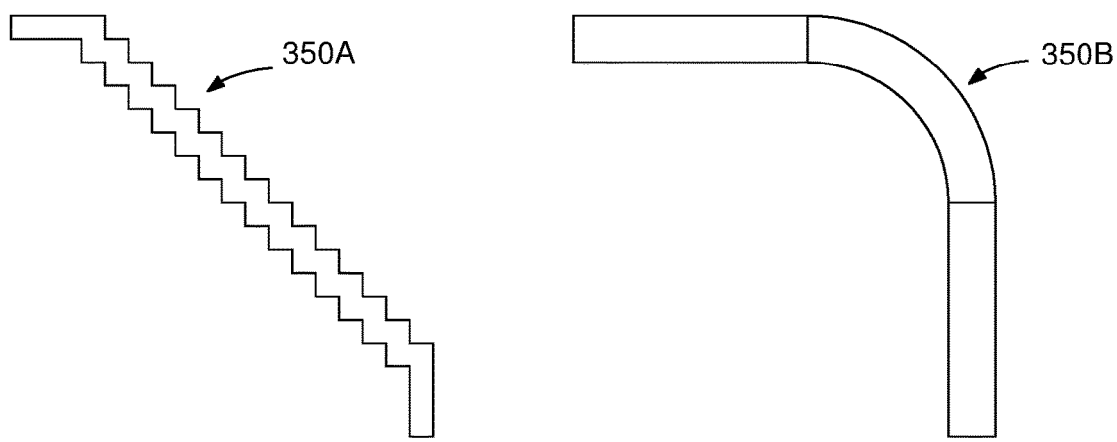
FIG. 3C illustrates in top view HV termination at the IGBT device corners using step and arc structures.

FIG. 3C shows top views of high voltage (HV) termination regions at the IGBT device corners using arc and step like structures. For the embodiment shown and described in FIGS. 3A-3B, the step like rather than the arc type corners may be used to accommodate p-side wall implantation for forming shields 316. To avoid side wall discontinuities, trenches in the corner regions of the HV termination regions may be designed to have a stair case trench structure 350A rather than arc type trench structure 350B of the conventional design. The stair case trench structure 350A may avoid formation of oxide spacers in deep trenches.

FIG. 4A illustrates a top view of an active MOSFET cell array 402 encircled by a p column 404 according to the present invention.

FIG. 4B illustrates top view of a group of IGBT active device cells 400A-400H formed according to the present invention.

FIG. 4C illustrates an IGBT device 90 formed on a substrate according to the present invention, in top view, including metallization and bonding pads. An HV termination region includes a first column ring surrounding the active IGBT cells. The first column ring is beneath the metal and passivation regions. The HV termination region extends along the edge of the substrate/wafer adjacent the saw street.

Figure 5A:
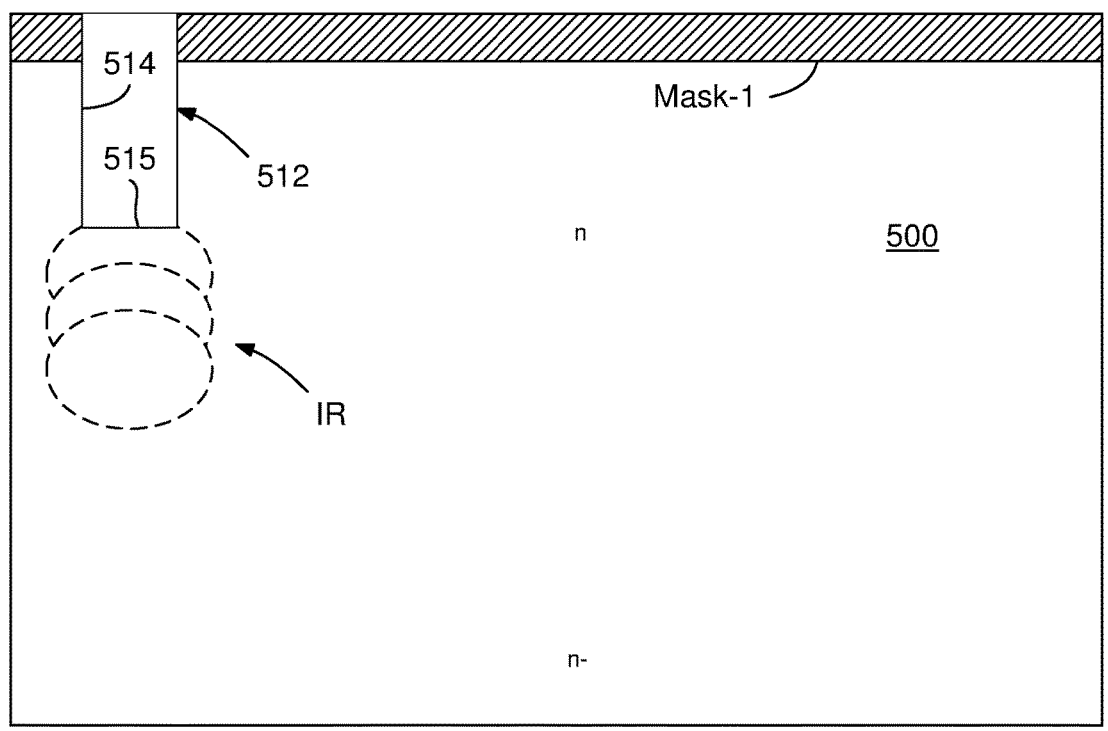
FIG. 5A illustrates a process of forming of p-columns including trench and p region for an IGBT.
Figure 5B:
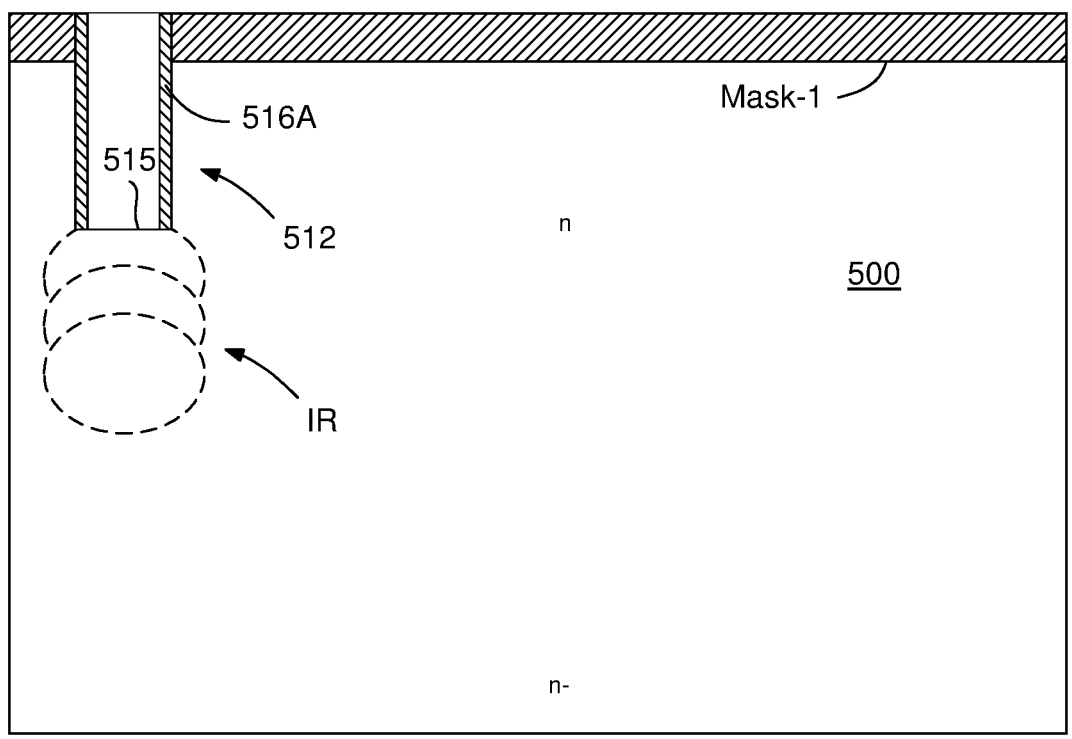
FIG. 5B illustrates a process of forming of p-columns including trench with oxide spacer and p region.

FIGS. 5A-5J illustrate a method of fabrication of an embodiment of an IGBT cell according to present invention. Accordingly, FIG. 5A illustrates a process of forming p-columns in a semiconductor substrate 500 using mask-1. A column trench 512 may be formed in the substrate 500 by trench etch. In the following step, high energy p-type implants (boron) may be implanted through the column trench 512 to form an implanted region 'IR' in the substrate. The column trench 512 may include trench side walls 514 and a trench floor 515. Implanted region 'IR' is depicted with circles under the column trench 512. In this embodiment, high energy dopant implantation may be performed before forming oxide side wall spacers 516A (FIG. 5B).

FIG. 5B may be an alternative process of forming the p-columns by employing mask-1. The process may include high energy p-dopant implantation through the trench floor 515 to form the implant region 'IR' after forming the oxide side wall spacers 516A.

Figure 5C:
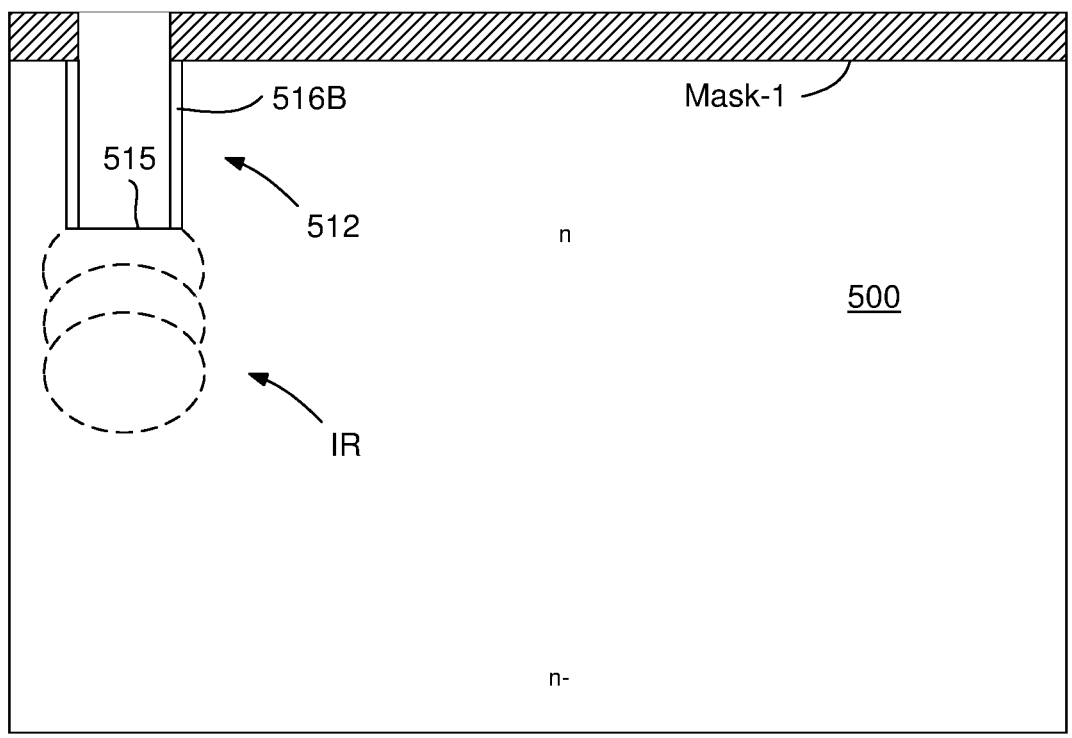
FIG. 5C illustrates a process of forming of p-columns including trench, high energy B implant to form p region, and side wall angle implant for processing without oxide spacers.

FIG. 5C illustrates another alternative process of forming p-columns with the column trench and high energy implant by employing mask-1. The process may include high energy boron implantation through the trench floor 515 to form the implant region 'IR' followed by side wall angle p-type implant to form side wall shields 516B.

Figure 5D:
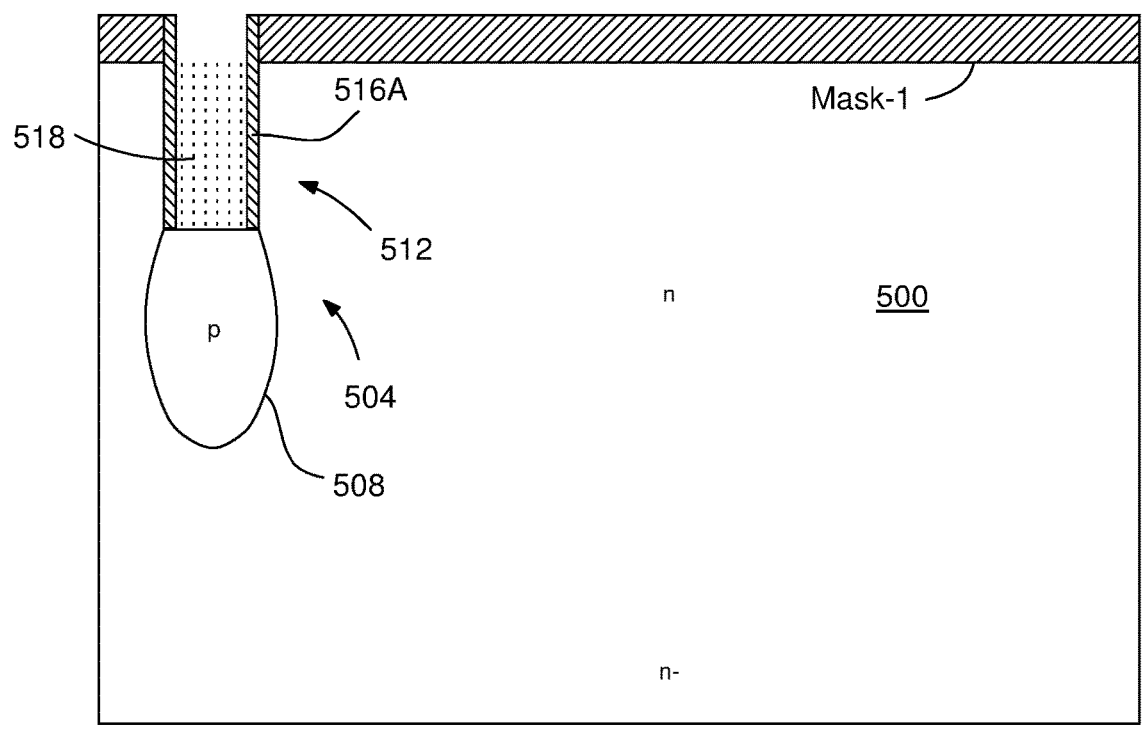
FIG. 5D illustrates a process of forming of p-columns including trench with p+ poly Si.

FIG. 5D illustrates an embodiment of a process for forming p-columns 504 by employing mask-1. The process may include the steps of: trench etching, and high energy p-type dopant implantation followed by the steps of oxide ($SiO_2$) deposition or oxide growth in the column trench 512 while driving in the p-type dopant (boron) implanted during the previous process step to form a deep p region 508, RIE etch of the oxide to define side wall spacers 516A inside the column trench 512, depositing poly Si into the column trench 512, followed by boron implantation for forming p+ poly Si in the column trench 512, and etching back the p+ poly Si to form the p+ poly Si trench filler 518.

Figure 5E:
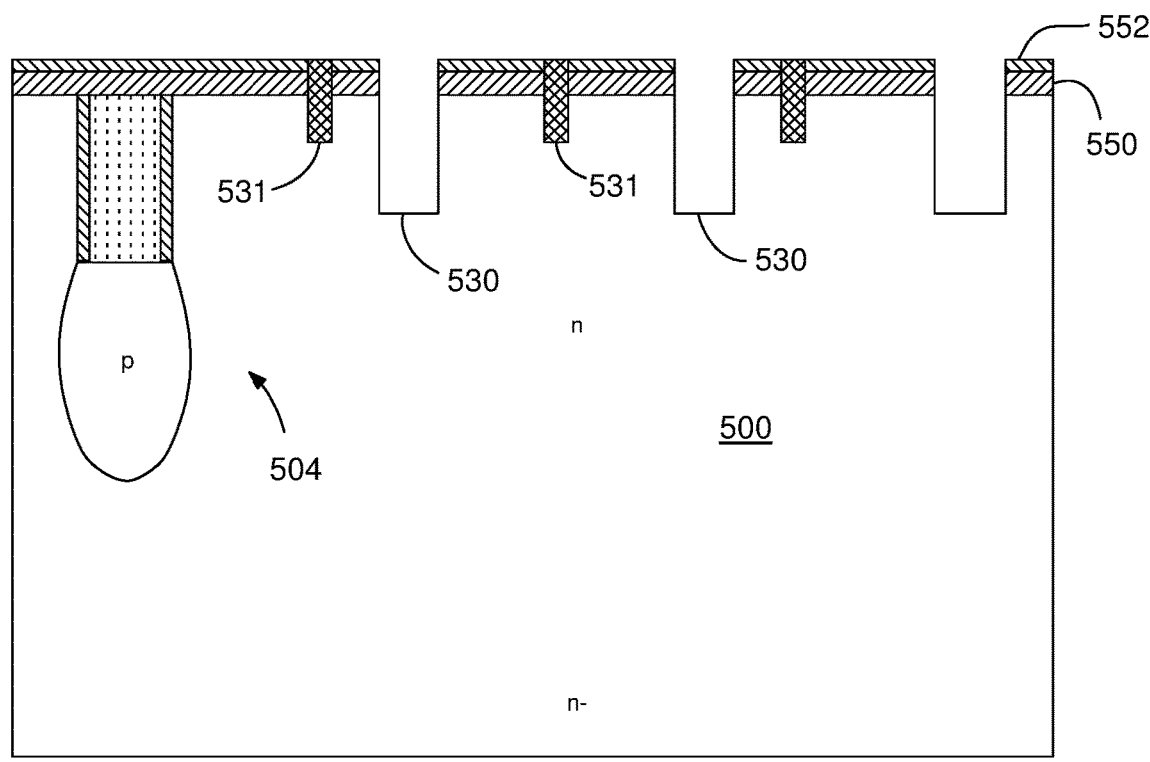
FIG. 5E illustrates a process of forming of multiple active MOSFET trench gates and a self-aligned base contact trenches of the IGBT in cross section.

FIG. 5E illustrates an embodiment of a process of forming of active MOSFET cells and self-aligned p-body contacts by employing mask-2 (not shown) on the substrate 500. The process may include the steps of: depositing an oxide ($SiO_2$) layer 550 and planarizing the oxide layer 550 over the p+ poly Si filler 518; depositing a nitride ($Si_3N_4$) layer 552 on the planarized oxide layer as an etch stop layer; and applying a photo mask (mask-2) to form active gate trenches 530 and self-aligned p-body contact trenches 531. FIG. 5E shows a cross-section of an IGBT cell with the active MOSFET gate trenches and self-aligned contacts after removing mask-2. Process steps after the removal of mask-2 may include: initially etching, for example, about 0.5 μm deep trench in silicon substrate for the active gate trenches 530 and etching the p-body contact trenches 531; depositing oxide to fill narrow p-body contact trenches 531; etching back the oxide isotopically to remove the oxide inside of active gate trenches 530 which are not filled completely, however, p-body contact trenches 531 may remain fully filled with the oxide. After the oxide etch step is completed, silicon may be etched, for example, another about 2.5 μm to achieve, for example, about 3 μm active gate trench depth for MOSFET cells.

Figure 5F:
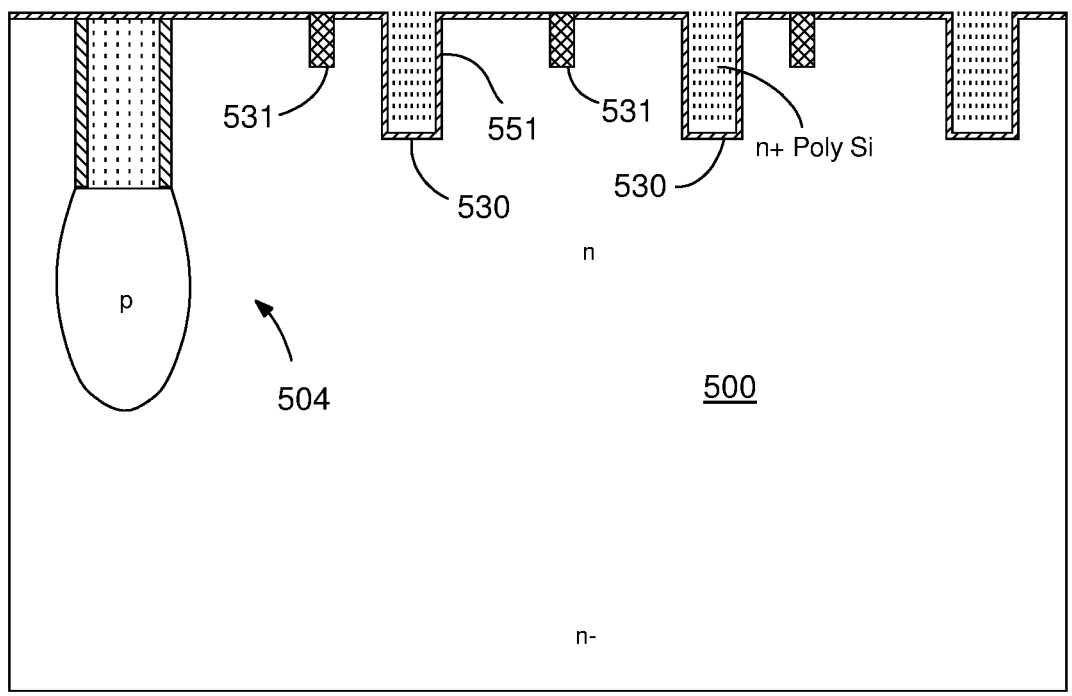
FIG. 5F illustrates a process of forming n+ poly Si in the active MOSFET trench gates, and CMP of the poly Si, of the IGBT in cross section.

FIG. 5F shows the cross section of the IGBT structure after the completion of gate oxidation to oxidize walls of the gate trenches 530 to form a dielectric layer 551, n+ poly silicon deposition to fill oxide lined gate trenches and CMP process step to planarize n+ poly silicon on the substrate 500.

Figure 5G:
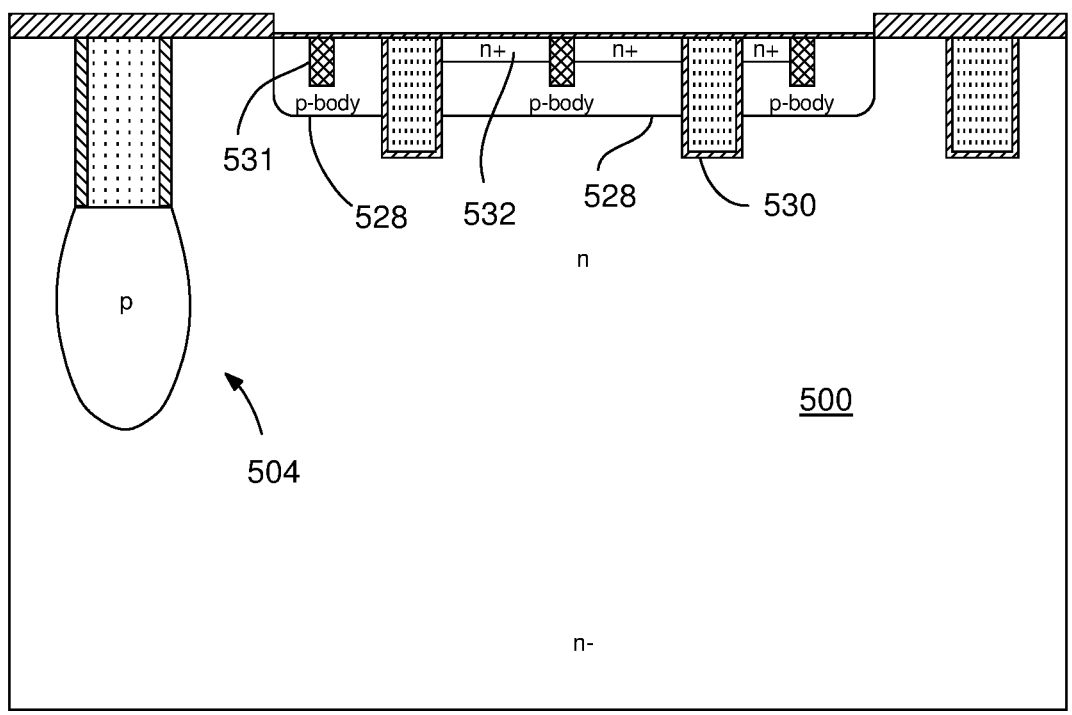
FIG. 5G illustrates a process of forming a p-body and n+-emitter of the IGBT in cross section.

FIG. 5G illustrates a cross section of the IGBT structure after mask-3 for forming p-body 528 and mask-4 for forming n+ emitter 532. The process steps may include etching back the oxide filling the p-body contact trenches 531 after p-body photo mask (mask-3); ion implanting the p-body 528; and applying mask-4 for implanting phosphorous and arsenic to form the n+ emitter 532.

Figure 5H:
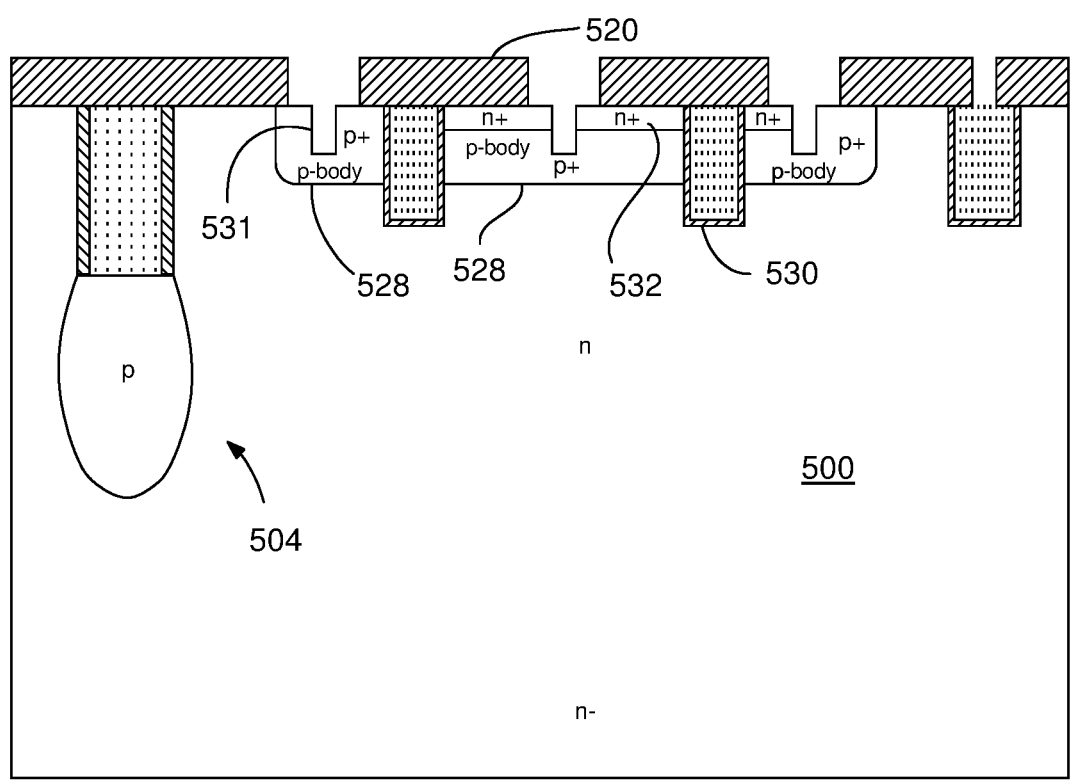
FIG. 5H illustrates a process of forming contact trenches.

FIG. 5H illustrates a cross section of the IGBT structure after mask-5 which is a contact mask. The process steps may include: depositing BPSG dielectric layer 520; applying contact mask (mask-5); etching BPSG layer 520; p+ low energy boron implanting (1-5E15 atoms $cm^{-2}$ or (1-5E15 $cm^{-2}$).

Figure 5I:
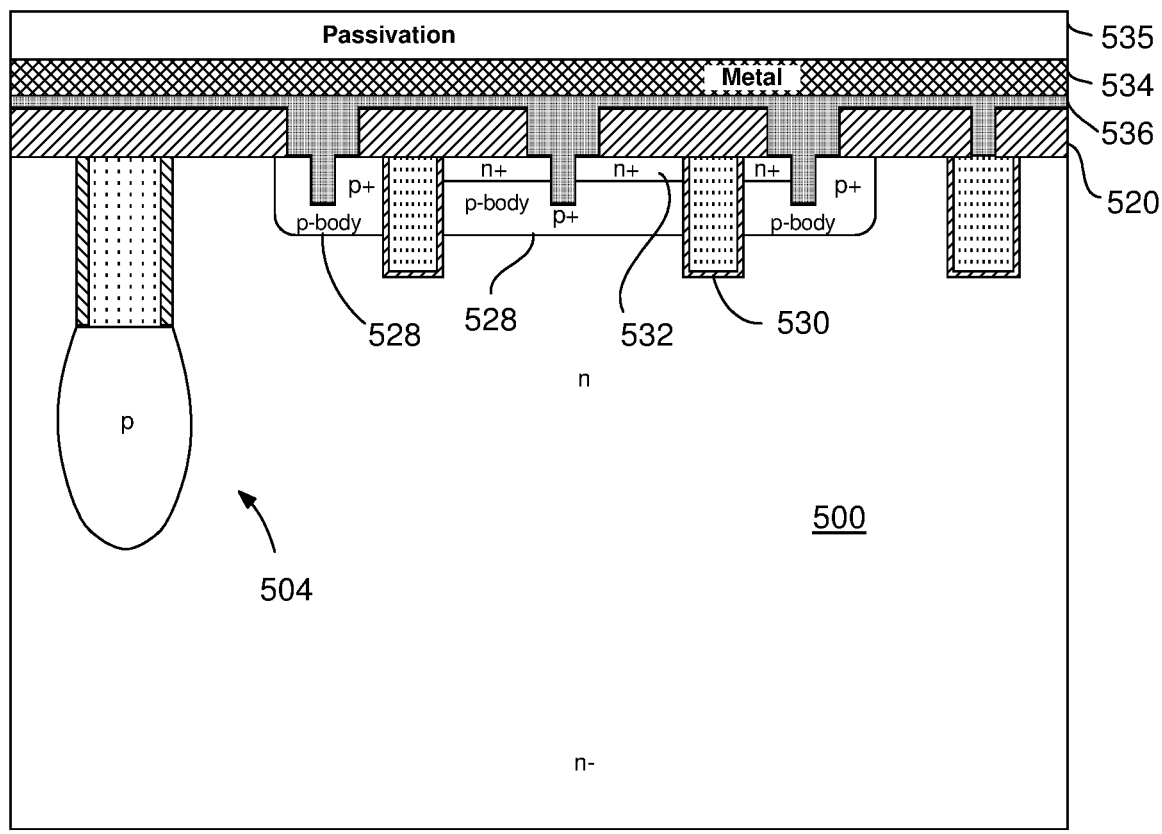
FIG. 5I illustrates a process of filling contact trenches and the application of metal and passivation layers.

FIG. 5I illustrates a cross section of the IGBT structure after mask-6 (metal mask) and mask-7 (passivation mask). The process steps may include: depositing a Ti/TiN/W buffer metal 536 and depositing, about 4 μm, Al:Si:Cu emitter metal 534; applying metal mask; etching using wet/dry/wet metal etch; depositing a passivation layer 535 including $SiO_2/Si_3N_4$ and poly-amide.

Figure 5J:
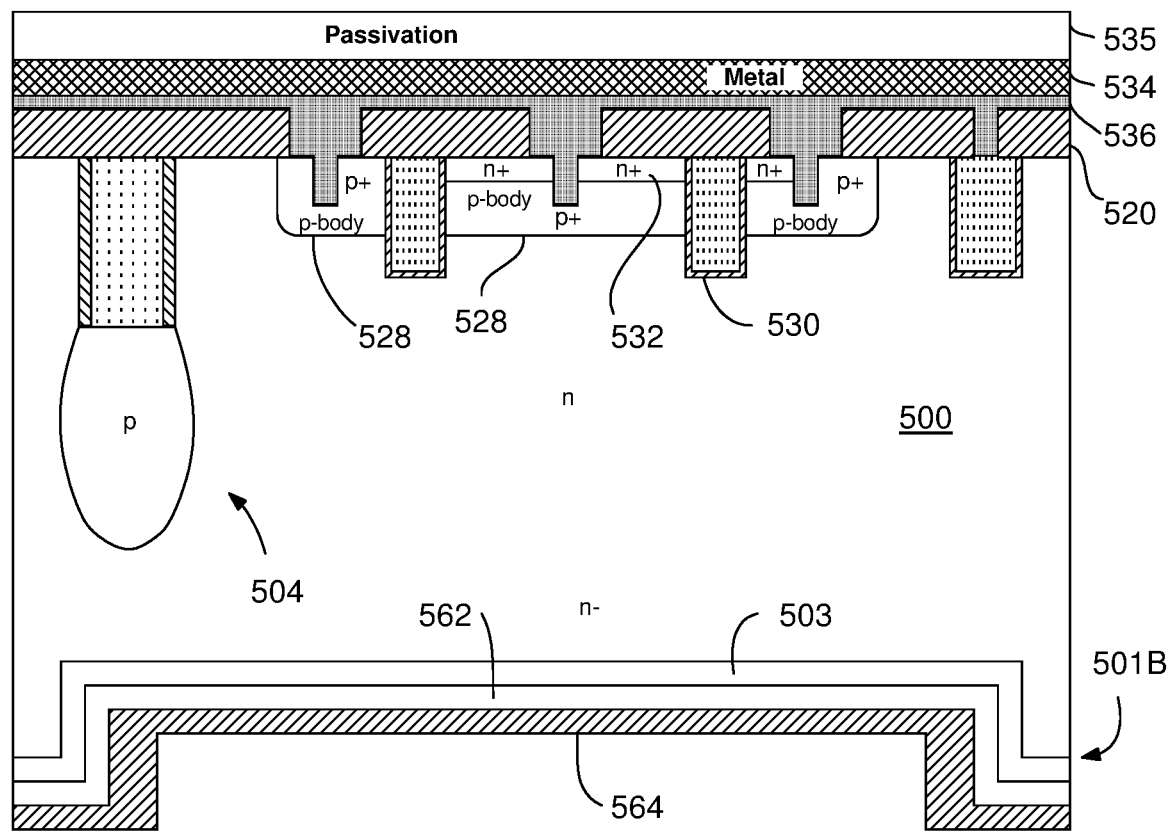
FIG. 5J illustrates a process of backside processing.

FIG. 5J illustrates a cross section of IGTB after backside process. The process steps may include the thinning of wafer backside 501B by Taiko grinding method or by etching to thin the wafers; removing grinding damage by etching; using implantation processes to form n-buffer field stop layer 503 and p/p+ hole injection layer 562 after the wafer thinning process is completed; annealing of the implantation by low temperature RTA or tube or laser annealing; depositing backside metal 564 including Al:Ti:Ni:Ag or Ti:Ni:Ag; metal sintering from 250° C. to 450° C. range.

Figure 6A:
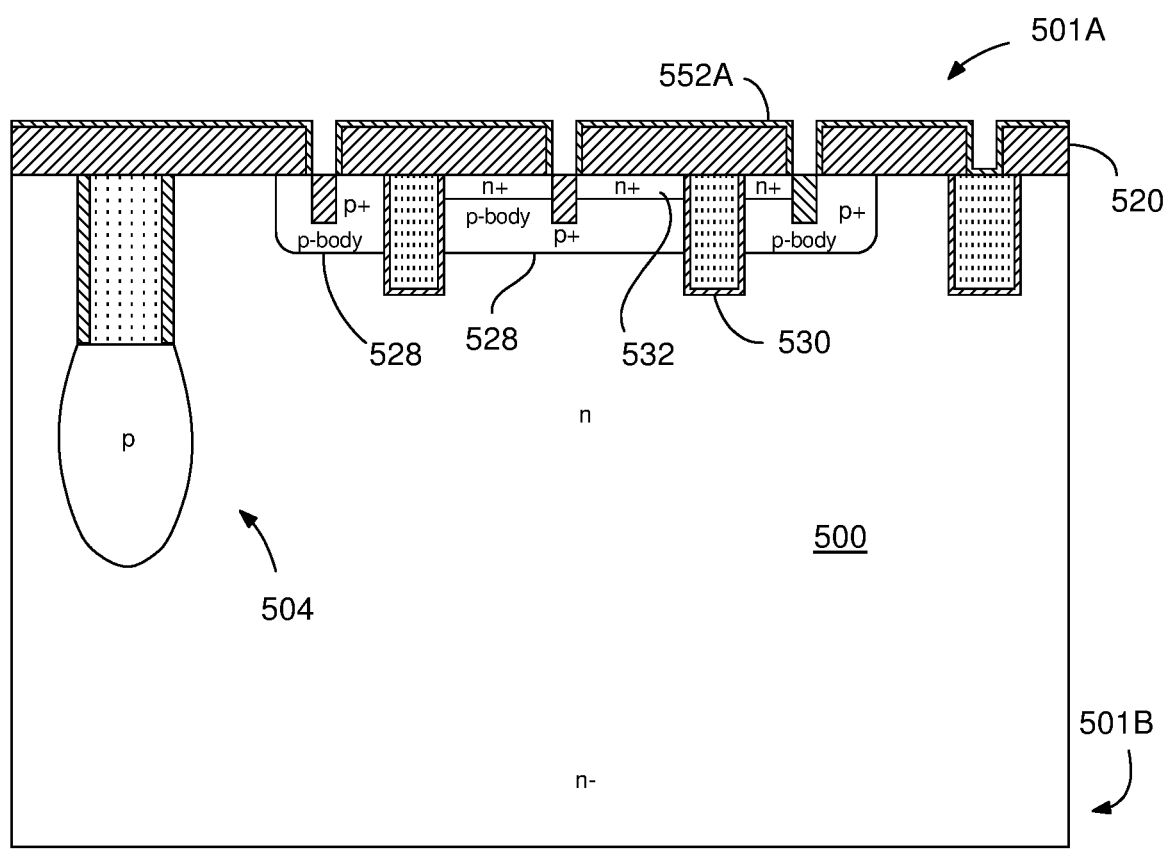
FIG. 6A illustrates an alternative process after the step shown in FIG. 5H.

FIG. 6A illustrates an embodiment of an IGBT process through the contact etching. After the contact etching of the BPSG 520 and implanting low energy p+ implant (1-5E15 cm−2) before starting the backside thinning (FIG. 6B) and implantation process, a thin layer of $SiO_2/Si_3N_4$ 552A (200 Å $SiO_2$ and 1000 Å $Si_3N_4$) may be deposited to protect substrate surface and the contacts at the front side 501A during backside processing.

Figure 6B:
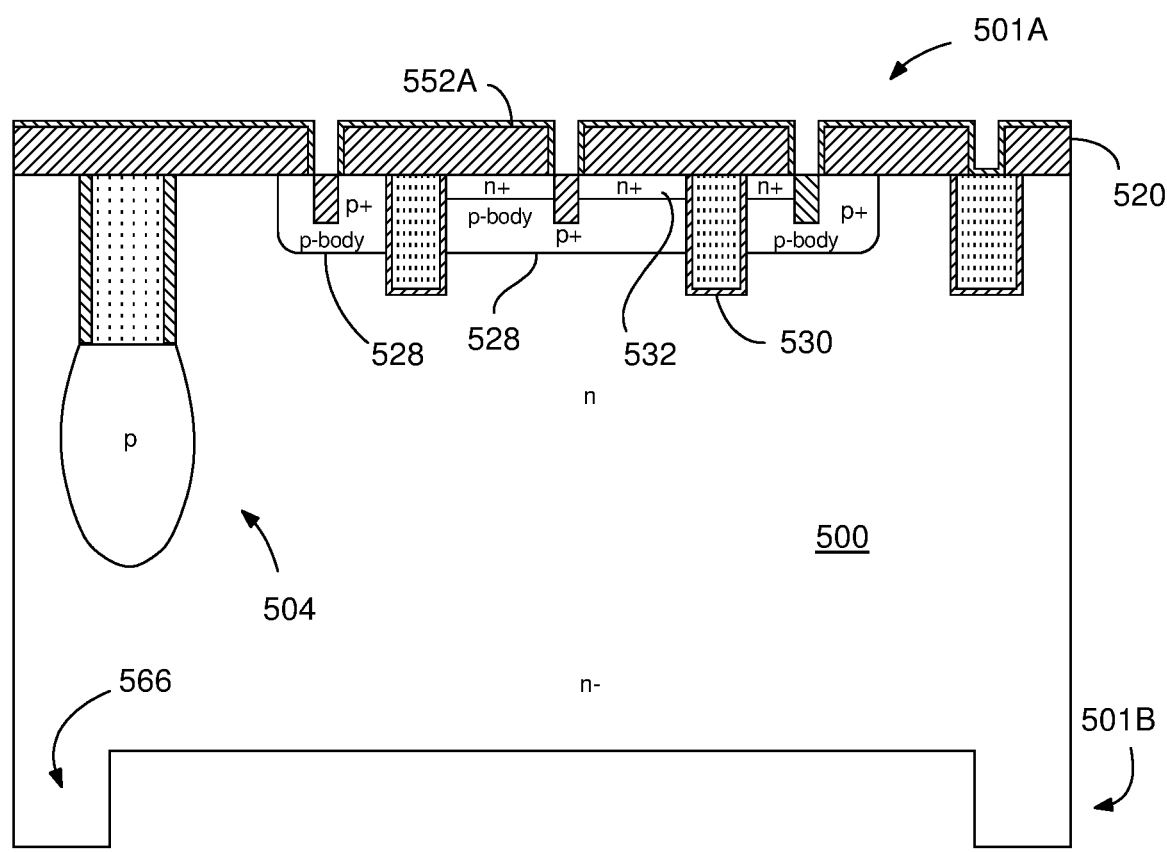
FIG. 6B illustrates an alternative process after the step shown in FIG. 6A, including protecting contacts during backside processing.
Figure 6C:
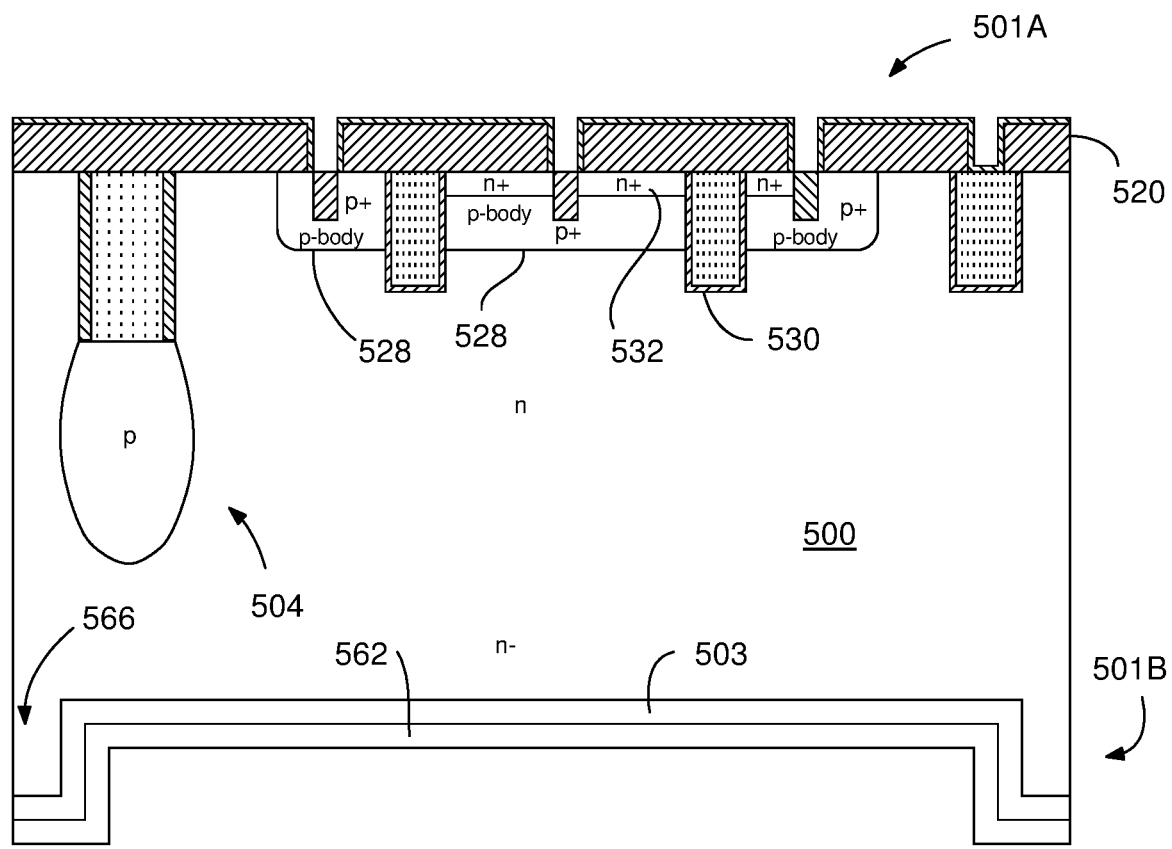
FIG. 6C illustrates an alternative process after the step shown in FIG. 6B, including wafer backside thinning to form a thick peripheral ring (Taiko ring)
Figure 6D:
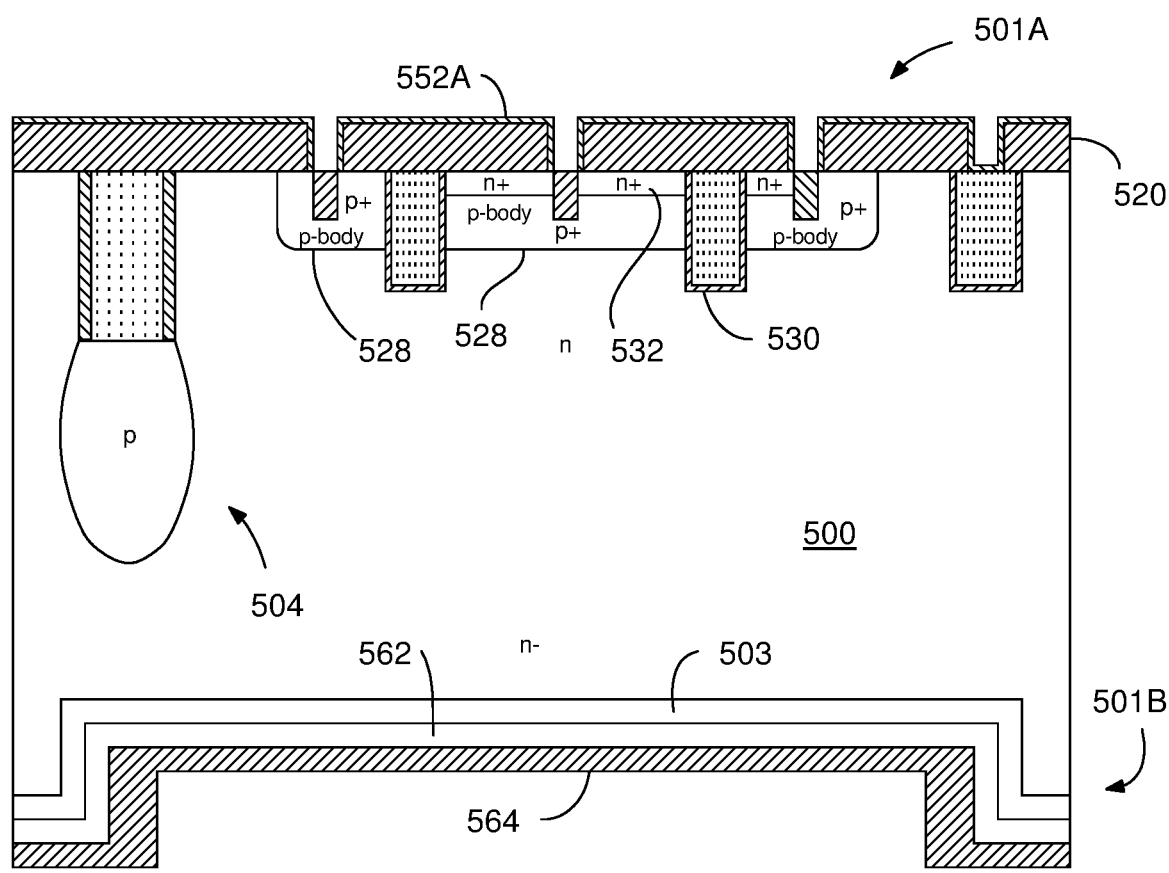
FIG. 6D illustrates an alternative process after the step show in FIG. 6C, including backside metallization.

FIGS. 6B-6D illustrate an exemplary backside implant activation and metallization process. Wafer backside 501B may be first grinded by Taiko or masked wet etching to leave a thick silicon ring 566 at outer periphery of the substrate or wafer to minimize warpage (FIG. 6B). Next, an n-buffer 503 or a field stop layer 503 and a p/p+ hole injection layer 562 may be formed, and then activated by regular RTA since there is no front side metallization. The backside process may be finalized by depositing a backside metal 564 including Al:Ti:Ni:Ag or Ti:Ni:Ag.

Figure 6E:
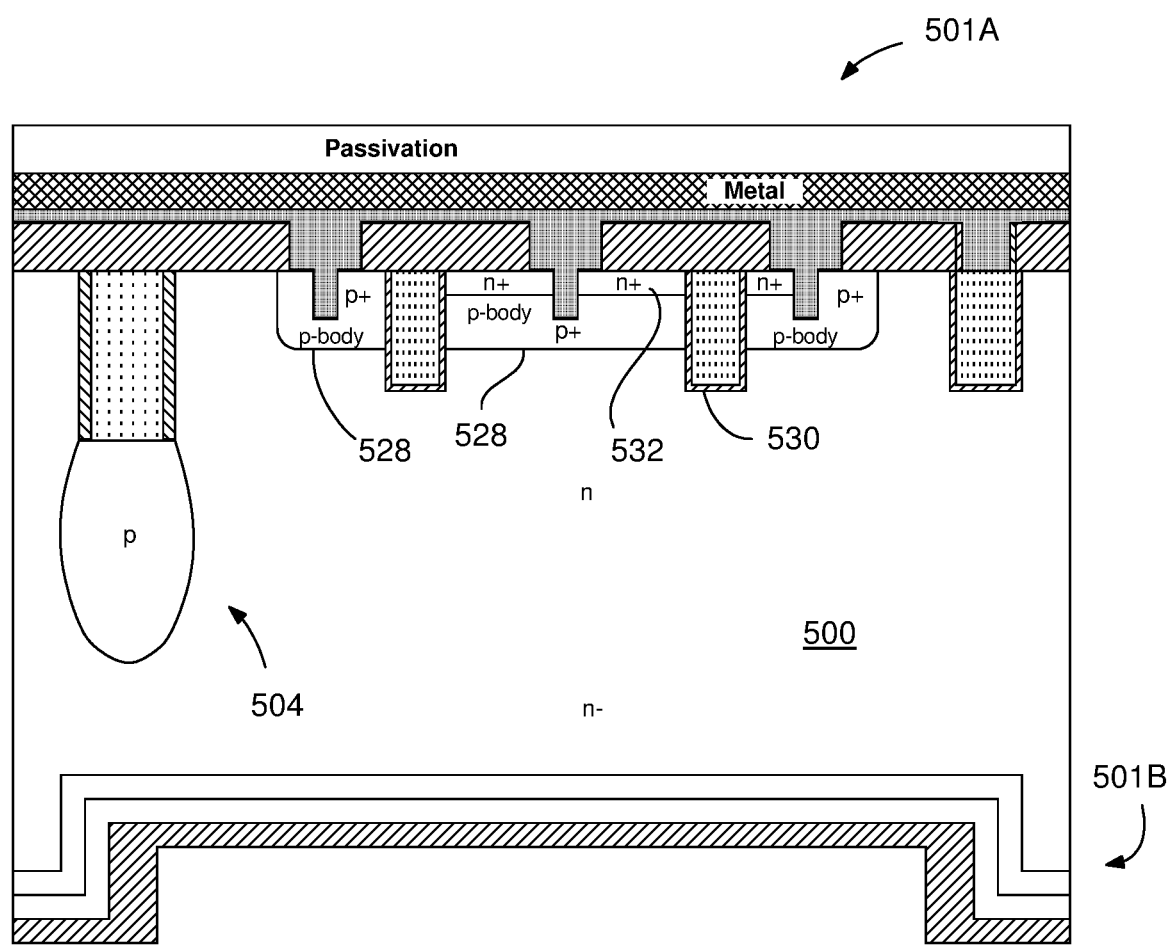
FIG. 6E illustrates an alternative process after the step show in FIG. 6D, including front side metallization.

After the backside implant activation and metallization is completed, as illustrated in FIG. 6E, wafer front side process continues with front side metallization process by depositing front metal layer including Ti/TiN/W/Al:Cu:Al; using metal mask to etch the front metal layer; depositing a passivation layer including $SiO_2/Si_3N_4$ and polyimide; and the process can be completed with the steps of pad opening and annealing.

An exemplary method of forming a vertical IGBT structure on a semiconductor substrate by mixing front side processing and backside processing may include: (a) an IGBT that has been processed up to front side metal deposition step; (b) after the contact etching process step, depositing a thin oxide of about 100-300 Å thickness range, next depositing a nitride ($Si_3N_4$) layer with a thickness range of 500-2000 Å for contact protection, as shown in FIG. 6A; (c) proceeding with wafer grinding and the backside damage removal etch, as shown in FIG. 6B; (d) applying backside implant for n-buffer and p+ implant, as shown in FIG. 6C;

(e) activating doping and annealing implant damages with RTA with proper thin wafer handling; (f) depositing backside metal Al/Ti/Ni/Ag or Ti/Ni/Ag, as shown in FIG. 6D; (g) going back to front side process by removing nitride contact protection layer selectively and next, etching about 100-300 Å of $SiO_2$ layer to remove oxides from the contact regions without etching BPSG dielectric layer; (h) depositing front metal, Ti/TiN/W buffer and Al:Si:Cu or Al:Cu, in the range of 1-8 µm thickness; (i) applying a metal mask and etching metal; (j) depositing passivation layer of plasma enhanced PSG (phosphorous doped silicon oxide) and nitride layer and also depositing polyimide layer in the range of 5-20 µm; (k) applying passivation mask and etching passivation layer, as shown in FIG. 6E; and (l) annealing wafers to restore threshold voltage of MOSFET/IGBT.

Although aspects and advantages of the present invention are described herein with respect to certain embodiments, modifications of the embodiments will be apparent to those skilled in the art. Even though the present inventions are using N channel type IGBT's as an example, the present inventions are also applicable to construction of P channel type IGBT's by replacing all n regions with p regions and all p regions with n regions. Thus, the scope of the present invention should not be limited to the foregoing discussion but should be defined by the appended claims.

What is claimed is:

1. A vertical insulated gate bipolar transistor (IGBT) device, comprising:
    an active metal-oxide-semiconductor field-effect transistor (MOSFET) cell array formed in a front side of a semiconductor substrate of n-type conductivity; and
    a plurality of column structures of p-type conductivity formed in the semiconductor substrate, the plurality of column structures being fully surrounding the active MOSFET cell array, each column structure including a trench filled with p-doped poly silicon, dielectric side wall spacers formed on the trench side walls except a bottom wall of the trench, and a deep region of p-type conductivity extending from the bottom wall of the trench, the plurality of column structures being substantially deeper than the active MOSFET cell array, wherein the plurality of column structures float.

2. The vertical IGBT device of claim 1, wherein the active MOSFET cell array includes trench MOSFET devices.

3. The vertical IGBT device of claim 1, wherein the active MOSFET cell array includes planar MOSFET devices.

4. The vertical IGBT device of claim 1, wherein the plurality of column structures are positioned apart from the active MOSFET cell array to electrically float during on-state of the vertical IGBT device.

5. The vertical IGBT device of claim 1, wherein the column structures in a high voltage termination region are not connected to an emitter electrode.

6. The vertical IGBT device of claim 1, wherein p-body contacts of the trench MOSFET devices are trench type and self-aligned to gate trenches.

7. The vertical IGBT device of claim 1, a backside of the semiconductor substrate is mechanically and chemically treated to remove silicon damage from the backside, and implanted to form n-buffer region, p and p+ hole injection region contacting with a collector electrode formed at the backside.

8. The vertical IGBT device of claim 1, a backside of the semiconductor substrate is mechanically and chemically treated to remove silicon damage from the backside, and implanted to form n-buffer region, p and alternating p+ hole injection and n+ regions contacting with a collector electrode formed at the backside.

9. The vertical IGBT device of claim 1, a backside of the semiconductor substrate is mechanically and chemically treated to remove silicon damage from the backside, and implanted to form n-buffer region and p region on which a p+ poly silicon injection region contacting with a collector electrode formed at the backside.

10. The vertical IGBT device of claim 1 further including a high voltage termination region including:
    a plurality of p type column structure, each column structure including a trench, filled with p type poly silicon, with or without dielectric side wall spacers on the trench side walls, and a p type deep region extending from a bottom wall of the trench, wherein the p type deep region is used as floating field ring;
    field plates, and
    metal oxide semiconductor (MOS) channel stops.

11. A vertical insulated gate bipolar transistor (IGBT) device, comprising:
    an active metal-oxide-semiconductor field-effect transistor (MOSFET) cell array formed in a front side of a semiconductor substrate of n-type conductivity; and
    at least one column structure of p-type conductivity formed in the semiconductor substrate, the at least one column structure being fully surrounding the active MOSFET cell array, at least one column structure including a trench filled with p-doped poly silicon, p-doped side wall regions formed on the trench side walls except a bottom wall of the trench, and a p-type deep region extending from the bottom wall of the trench, wherein the at least one column structure floats and it is substantially deeper than the active MOSFET cell array.

12. The vertical IGBT device of claim 11, wherein the p-doped side wall regions prevent p-dopant depletion in p-doped poly silicon.

13. The vertical IGBT device of claim 11, wherein the at least one column structure includes a plurality of column structures fully surrounding the active MOSFET cell array.

14. The vertical IGBT device of claim 11 further comprising one of an isolation structure, a planar MOS or a trench MOS between the at least one column structure and the active MOSFET cell array.

15. The vertical IGBT device of claim 11 further comprising step like corner structure at a high voltage termination region of the vertical IGBT device.

16. The vertical IGBT device of claim 11, a backside of the semiconductor substrate is mechanically and chemically treated to remove silicon damage, and implanted to form n-buffer region, p and p+ hole injection region contacting with a collector electrode formed at the backside.

17. The vertical IGBT device of claim 11, a backside of the semiconductor substrate is mechanically and chemically treated to remove silicon damage, and implanted to form n-buffer region, p and alternating p+ hole injection and n+ regions contacting with a collector electrode formed at the backside.

18. The vertical IGBT device of claim 11, a backside of the semiconductor substrate is mechanically and chemically treated to remove silicon damage, and implanted to form n-buffer region and p region on which a p+ poly silicon injection region contacting with a collector electrode formed at the backside.

* * * * *